(12) United States Patent
Langer et al.

(10) Patent No.: US 7,311,008 B2
(45) Date of Patent: Dec. 25, 2007

(54) SEMICONDUCTOR STRUCTURE COMPRISING A STRESS SENSITIVE ELEMENT AND METHOD OF MEASURING A STRESS IN A SEMICONDUCTOR STRUCTURE

(75) Inventors: Eckhard Langer, Radebeul (DE); Ehrenfried Zschech, Moritzburg (DE)

(73) Assignee: Advanced Micro Devices, Inc., Austin, TX (US)

( * ) Notice: Subject to any disclaimer, the term of this patent is extended or adjusted under 35 U.S.C. 154(b) by 323 days.

(21) Appl. No.: 11/058,706

(22) Filed: Feb. 15, 2005

(65) Prior Publication Data

US 2005/0263760 A1  Dec. 1, 2005

(30) Foreign Application Priority Data

May 28, 2004  (DE)  ............. 10 2004 026 145

(51) Int. Cl.
*G01B 5/00* (2006.01)
*G01L 1/24* (2006.01)

(52) U.S. Cl. .......................... 73/777; 73/800
(58) Field of Classification Search ............... 73/777
See application file for complete search history.

(56) References Cited

U.S. PATENT DOCUMENTS

| | | | |
|---|---|---|---|
| 3,994,009 A * | 11/1976 | Hartlaub | 257/419 |
| 4,444,054 A * | 4/1984 | Schaff, Jr. | 73/708 |
| 4,576,052 A * | 3/1986 | Sugiyama | 73/862.68 |
| 5,059,556 A * | 10/1991 | Wilcoxen | 438/52 |
| 5,204,540 A | 4/1993 | Nakashima et al. | 257/480 |
| 5,214,729 A | 5/1993 | Koai | 385/27 |
| 5,232,547 A * | 8/1993 | Drowley et al. | 117/55 |
| 5,387,803 A * | 2/1995 | Kurtz et al. | 257/3 |
| 5,587,343 A * | 12/1996 | Kano et al. | 438/52 |

(Continued)

FOREIGN PATENT DOCUMENTS

DE   3335772 A1   4/1984

(Continued)

OTHER PUBLICATIONS

Chen et al., "Annealing and oxidation of silicon oxide films prepared by plasma-enhanced chemical vapor deposition," *J. Applied Physics*, 97:014913, 2005.
PCT Partial International Search Report, PCT/US2005/010474, dated Oct. 16, 2006.

*Primary Examiner*—Max Noori
(74) *Attorney, Agent, or Firm*—Williams, Morgan & Amerson, P.C.

(57) ABSTRACT

A semiconductor structure comprises a stress sensitive element. A property of the stress sensitive element is representative of a stress in the semiconductor structure. Additionally, the semiconductor structure may comprise an electrical element. The stress sensitive element and the electrical element comprise portions of a common layer structure. Analyzers may be adapted to determine a property of the stress sensitive element being representative of a stress in the semiconductor structure and a property of the electrical element. The property of the stress sensitive element may be determined and the manufacturing process may be modified based on the determined property of the stress sensitive element. The property of the electrical element may be related to the property of the stress sensitive element in order to investigate an influence of stress on the electrical element.

17 Claims, 10 Drawing Sheets

U.S. PATENT DOCUMENTS

| | | |
|---|---|---|
| 5,680,209 A | 10/1997 | Mächler ................... 356/319 |
| 5,908,981 A | 6/1999 | Atular et al. ................ 73/105 |
| 6,208,418 B1 | 3/2001 | Maris ........................ 356/388 |
| 6,493,497 B1 | 12/2002 | Ramdani et al. ............ 385/131 |
| 6,509,201 B1 | 1/2003 | Wright ........................ 438/16 |
| 6,567,715 B1 | 5/2003 | Sinclair et al. ............. 700/110 |
| 6,600,565 B1 | 7/2003 | Suresh et al. ............... 356/521 |
| 2002/0190252 A1 | 12/2002 | Adams et al. ................ 257/48 |
| 2003/0066356 A1 | 4/2003 | Kanellopoulos et al. ...... 73/800 |
| 2003/0098704 A1 | 5/2003 | Du-Nour et al. ............ 324/765 |
| 2004/0098216 A1 | 5/2004 | Ye et al. ..................... 702/127 |

FOREIGN PATENT DOCUMENTS

| | | |
|---|---|---|
| DE | 19909777 A1 | 9/2000 |
| DE | 10154495 A1 | 5/2003 |
| EP | 0 378 098 A2 | 7/1990 |
| EP | 0 740 139 A1 | 4/1996 |
| WO | WO 01/82335 A2 | 11/2001 |

\* cited by examiner

SEMICONDUCTOR STRUCTURE COMPRISING A STRESS SENSITIVE ELEMENT AND METHOD OF MEASURING A STRESS IN A SEMICONDUCTOR STRUCTURE

BACKGROUND OF THE INVENTION

1. Field of the Invention

The present invention relates to the field of manufacturing of semiconductor devices, and, more particularly, to the measurement of stress in semiconductor structures.

2. Description of the Related Art

Integrated circuits comprise a large number of individual circuit elements such as, e.g., transistors, capacitors and resistors. These elements are connected internally via electrically conductive lines to form complex circuits such as memory devices, logic devices, and microprocessors. An improvement in the performance of integrated circuits requires a reduction of feature sizes. In addition to an increase in the speed of operation due to reduced signal propagation times, reduced feature sizes allow an increase in the number of functional elements in the circuit in order to extend its functionality. Today, advanced semiconductor structures can comprise features having a size of 0.1 µm or less.

As the size of structural elements such as circuit elements and electrically conductive lines decreases, the effects of stress become more and more important. Electrically conductive lines are typically embedded in an interlayer dielectric. If stress occurs in the interlayer dielectric, the mechanical connection between the electrically conductive lines and the interlayer dielectric and/or structural elements they are connected to, such as other electrically conductive lines and circuit elements, can be weakened. This may adversely affect the stability of the integrated circuit and lead to an increased contact resistance between the electrically conductive lines. The increased contact resistance, in turn, may adversely affect the functioning of the integrated circuit, and may lead to a quick deterioration of the circuit due to an excessive formation of heat. Stress may also lead to a detachment of the electrically conductive line from a structural element it is connected to, which can result in a failure of the integrated circuit.

Stress in the interlayer dielectric may be particularly disadvantageous if the interlayer dielectric comprises low-k materials that are employed to decrease signal propagation delays due to parasitic capacitances. Since these materials have comparatively weak bondings, the stress may even lead to the formation of cracks and/or to the detaching of electrically conductive lines from the interlayer dielectric.

Conversely, stress may be intentionally utilized to enhance the performance of circuit elements. Tensile or compressive stress in a semiconductor material may result in a modified mobility of electrons and holes. Creating tensile stress increases the mobility of electrons, wherein, depending on the magnitude of the tensile stress, an increase by up to 20% may be achieved, which, in turn, directly translates into a corresponding increase in the conductivity. The stress-induced increase in the mobility of electrons may be used to enhance the performance of N-type field effect transistors by increasing the mobility of charge carriers in the channel region. On the other hand, compressive stress in the channel region of a P-type field effect transistor increases the mobility of holes, which may be used to enhance the performance of the transistor.

In order to create tensile or compressive stress in the channel region of a transistor, it has been proposed to introduce, for example, a silicon/germanium layer or a silicon/carbon layer into or below the channel region. Alternatively, stress in the channel region may be created by depositing a strained spacer layer and etching the strained spacer layer to create spacer elements having tensile or compressive stress adjacent the gate electrode.

Thus, stress in an integrated circuit may significantly affect the performance of the circuit. Hence, a measurement of stress in a semiconductor structure may be important in the design of an integrated circuit or a structural element thereof.

A method for measuring a stress in a semiconductor structure according to the state of the art will now be described. Typically, the curvature of a substrate is measured using a profiler (profilometer), which is an instrument adapted to scan a surface of the substrate by means of a stylus. Subsequently, a layer of a material is deposited on the substrate. If the deposition of the layer of material generates stress, the substrate is bent. Hence, the curvature of the substrate is altered. After the deposition of the layer, the curvature of the substrate is measured once again. Then, the stress in the film is calculated from the curvatures measured before and after the deposition of the layer by means of an equation derived by means of the theory of elasticity.

One problem with the conventional measurement of stress in a semiconductor structure is that the thickness of the substrate enters into the calculation of the stress. The thicker the substrate, the smaller the alteration of the curvature resulting from a particular stress and, thus, the less sensitive the measurement. Thin substrates, on the other hand, are easily deformed by gravity, which may also adversely affect the precision of the measurement.

Another problem of the conventional measurement of stress in a semiconductor structure is that the curvature of the substrate must be measured over a range of up to several centimeters, such that inhomogeneities of the substrate and/or the deposited layer may lead to erroneous results in the measurement.

Yet another problem of the conventional measurement of stress in a semiconductor structure is that to measure stress between a first material and a second material, a substrate consisting of one of the materials is provided. This may significantly increase the costs of the measurement process, in particular if materials that are expensive and/or difficult to handle are investigated.

Yet another problem of the conventional measurement of stress in a semiconductor structure is that the measurement cannot be performed in situ while the semiconductor structure is being processed.

In view of the above-mentioned problems, a need exists for a system and method allowing precise measurement of stress in a semiconductor structure.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment of the present invention, a semiconductor structure comprises a stress sensitive element. A property of the stress sensitive element is representative of a stress condition in the semiconductor structure. Additionally, the semiconductor structure comprises an electrical element. The stress sensitive element and the electrical element comprise portions of a common layer structure.

According to another illustrative embodiment of the present invention, a system for measuring a stress in a semiconductor structure comprises a stress sensitive element formed in the semiconductor structure and an electrical element formed in the semiconductor structure. The stress sensitive element and the electrical element comprise portions of a common layer structure. The system comprises a first analyzer adapted to determine a property of the stress sensitive element, the property being representative of a stress condition in the semiconductor structure, and a second analyzer adapted to determine a property of the electrical element.

According to yet another illustrative embodiment of the present invention, a system for measuring a stress in a semiconductor structure comprises a stress sensitive element formed in the semiconductor structure and an analyzer. The analyzer comprises a light source and a light detector. The analyzer is adapted to determine a property of the stress sensitive element, the property being representative of a stress condition in the semiconductor structure.

According to yet another illustrative embodiment of the present invention, a method for adjusting a manufacturing process for a semiconductor structure comprises forming a first semiconductor structure by means of the manufacturing process. In addition, the method comprises forming a stress sensitive element in the first semiconductor structure. A property of the stress sensitive element is determined. The property is representative of a stress condition in the first semiconductor structure. The manufacturing process is modified based on the determined property of the stress sensitive element. A second semiconductor structure is formed by means of the modified manufacturing process and an electrical element is formed in the second semiconductor structure.

According to yet another illustrative embodiment of the present invention, a method of investigating an influence of stress on an electrical element in a semiconductor structure comprises forming a stress sensitive element in the semiconductor structure and forming an electrical element in the semiconductor structure. A property of the stress sensitive element is determined. The property is representative of a stress condition in the semiconductor structure. A property of the electrical element is determined. The property of the electrical element is related with the property of the stress sensitive element.

BRIEF DESCRIPTION OF THE DRAWINGS

The invention may be understood by reference to the following description taken in conjunction with the accompanying drawings, in which like reference numerals identify like elements, and in which.

Figure 1:
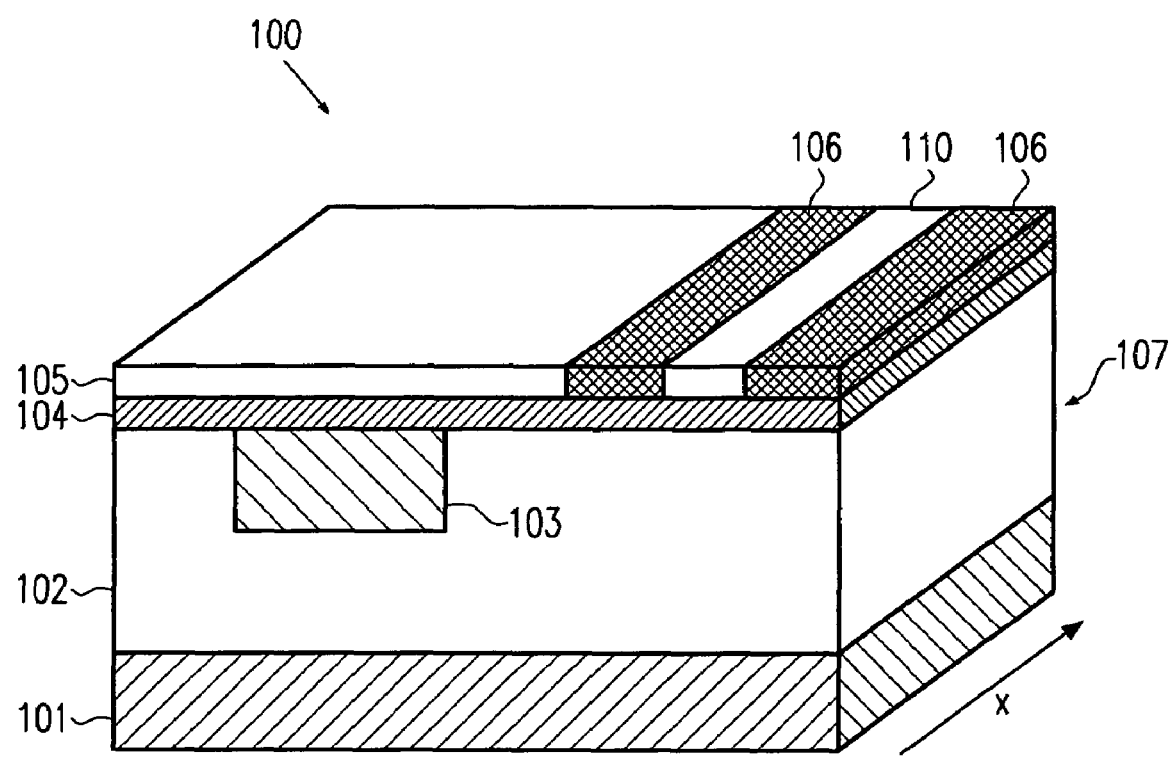
FIG. 1 shows a schematic view of a semiconductor structure according to an embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention enables the measurement of mechanical stress in a semiconductor structure to determine its influence on an electrical element that may be, e.g., an electrically conductive line or a field effect transistor, and to adjust a manufacturing process for the semiconductor structure. The stress sensitive element may be implemented during the wafer level manufacturing process by means of process steps used in semiconductor manufacturing. The measurement can be performed in situ during the manufacturing of the semiconductor structure to monitor a buildup and/or a relaxation of the stress in the semiconductor structure and/or can be performed after the completion of the semiconductor structure. The present invention can be used to monitor stress properties of a semiconductor structure, which may be, e.g., a wafer comprising one or more integrated circuits, in situ or in-line during an industrial production process and to modify the production process in order to control a stress in the manufactured semiconductor structure.

According to illustrative embodiments, a semiconductor structure comprises a stress sensitive element, a property of which is representative of a stress condition in the semiconductor structure. Additionally, the semiconductor structure can comprise an electrical element. The stress sensitive element and the electrical element may comprise portions of a common layer structure. By determining the property of the stress sensitive element, one may measure a stress in the semiconductor structure affecting the electrical element. A property of the electrical element can be determined and related to the property of the stress sensitive element to investigate the influence of stress on the performance of the electrical element.

In other embodiments of the present invention, a stress sensitive element is formed in a first semiconductor structure and a property of the stress sensitive element that is representative of a stress condition in the first semiconductor structure is determined. Then, a manufacturing process used to manufacture the first semiconductor structure is modified, taking into account the stress conditions in the first semiconductor structure inferred from the property of the stress sensitive element. A second semiconductor structure is fabricated by means of the modified manufacturing process, and an electrical element is formed in the second semiconductor structure. Thus, the electrical element in the second semiconductor structure can be exposed to well-defined stress conditions.

A system for measuring a stress in a semiconductor structure can comprise a stress sensitive element formed in a semiconductor structure and an analyzer being adapted to determine the property of the stress sensitive element. In particular, this analyzer may be configured to determine the property by optical means. Additionally, a second analyzer adapted to determine a property of an electrical element formed in the semiconductor structure may be provided.

FIG. 1 shows a schematic view of a semiconductor structure 100 according to one illustrative embodiment of the present invention. The semiconductor structure 100 comprises a substrate 101. A layer structure 107 is formed over the substrate 101. The layer structure 107 comprises a layer 102 of a first material, a layer 104 of a second material, and a layer 105 of a third material. A stress sensitive element is provided in the form of a line 103 of transparent material extending through the layer 102 in the semiconductor structure 100 in a longitudinal direction x. The layer 105 comprises an electrical element provided in the form of an electrically conductive line 110. The electrically conductive line 110 is separated from other portions of the layer 105 by insulating portions 106.

The transparent material of the line 103 can comprise a glass, a polymer, a ceramic material or any other material having a high transmissibility for light. Hereby, the term "light" is to be understood to include the visible wavelength region as well as infrared and ultraviolet light. The ceramic material can comprise aluminum oxide ($Al_2O_3$). The layer 102 can comprise a first dielectric material that may comprise, e.g., silicon dioxide. The layer 103 may comprise a second dielectric material, e.g., a low-k material such as hydrogenated silicon oxycarbide (SiCOH). The third material may comprise a metal, e.g., copper. In other embodiments of the present invention, the first and the second materials may comprise a substantially same dielectric material, e.g., silicon dioxide.

In further embodiments of the present invention, the semiconductor structure 100 may comprise an electrical element other than an electrically conductive line. In particular, the electrical element may comprise a field effect transistor.

In such embodiments, the layer 102 and the layer 105 may comprise silicon. The layer 104 can be adapted to create a compressive or tensile stress in the layer 105, and may comprise, e.g., an alloy of silicon and germanium, or an alloy of silicon and carbon. A channel region of the field effect transistor may be formed in the layer 105. The substrate 101 may comprise an insulator material such as silicon dioxide. Thus, the field effect transistor is formed in a silicon on insulator configuration. Alternatively, the substrate 101 may comprise a semiconductor material, e.g., silicon.

A property of the stress sensitive element 103 is representative of a stress condition in the semiconductor structure 100.

The property may be a length of an optical path of light passing through the line 103 of transparent material. If stress is present in the semiconductor structure 100, the line 103 of transparent material is deformed. The line 103 can be stretched in the longitudinal direction x, such that a length of the line 103 increases, or compressed in the longitudinal direction x, such that a length of the line 103 decreases, depending on whether the layer structure 107 is subjected to tensile or compressive stress.

As the length of the line 103 increases or decreases, respectively, a length of an optical path of light passing through the line 103 of transparent material increases or decreases, respectively. Hence, the length of the optical path of light passing through the line 103 of transparent material is a property of the line 103 representative of a stress condition in the semiconductor structure (100).

In other embodiments of the present invention, the property of the line 103 of transparent material representative of a stress condition in the semiconductor structure 100 is a wavelength of light reflected in the line 103 of transparent material.

To this end, the line 103 can comprise a grating region wherein an index of refraction exhibits periodical variations in the longitudinal direction x. The grating region comprises zones wherein the refractive index of the transparent material is higher than in other portions of the line 103. The zones of higher refractive index have a predetermined spacing.

Due to the refractive index variations, light is scattered due to the Bragg effect. If light having a wavelength passes through the line 103 of transparent material in a propagation direction substantially parallel to the longitudinal direction x, a portion of the light is scattered in a backward direction opposite to the propagation direction at each of the zones of higher refractive index.

If the wavelength of the light in the transparent material is substantially equal to twice the spacing of the zones of higher refractive index, the portions of the light reflected at the zones of higher refractive index interfere constructively. This entails that a large fraction of the light is reflected by the grating portion and the transmissibility of the line 103 of transparent material for the light is low.

Conversely, if the wavelength of the light in the transparent material differs significantly from twice the spacing of the zones of higher refractive index, the portions of the light reflected at the zones of higher refractive index interfere destructively. Thus, the light is not reflected at the grating region and is transmitted through the grating region.

If light having a continuum of wavelengths passes the line 103 of transparent material, a portion of the light having a wavelength in the transparent material substantially equal to twice the spacing of the zones of higher refractive index is reflected. The rest of the light is substantially transmitted through the line 103 of transparent material. Therefore, a spectrum of the reflected light comprises a peak at a characteristic wavelength representative of the spacing of the zones of higher refractive index. The spectrum of the transmitted light comprises a minimum at the characteristic wavelength.

If stress is present in the semiconductor structure 100, the line 103 of transparent material is stretched or compressed. Thereby, the spacing between the zones of higher refractive index increases or decreases. This entails that the characteristic wavelength of the line 103 increases or decreases. Hence, the characteristic wavelength is a property representative of a stress condition in the semiconductor structure 100.

The line 103 can extend through a substantial portion of the semiconductor structure 100. In some embodiments of the present invention, the semiconductor structure 100 comprises a wafer comprising a plurality of chips. The plurality of chips comprises electrical elements including the electrical element described above. The line 103 can be formed in spacings (scribe lines) between the chips provided for cutting the wafer after the manufacturing process. Advantageously, this enables provision of the stress sensitive element in the semiconductor structure substantially without requiring additional wafer area. In other embodiments of the present invention, the wafer comprises a test structure wherein the line 103 is formed.

The grating region can comprise a substantial portion of the line 103 of transparent material. Thus, an average stress in the semiconductor structure 100 can be measured. In other embodiments of the present invention, the grating region comprises a portion of the semiconductor structure 100 only. The grating region can have a length less than 400 μm. In other embodiments of the present invention, the grating region can have a length less than 200 μm or less than 100 μm. Advantageously, this allows a specific measurement of stress in a small region of the semiconductor structure 100.

In further embodiments of the present invention, the property of the line 103 of transparent material representative of a stress condition in the semiconductor structure 100 is a birefringence of light in the transparent material. In such embodiments, the transparent material can comprise a glass, a polymer, or any other transparent material exhibiting stress-induced birefringence known to persons skilled in the art.

If stress is present in the semiconductor structure 100, the line 103 of transparent material is also subjected to the stress. The stress induces a birefringence of the transparent material. In birefringence, an index of refraction of the material depends on the polarization direction of light passing through the line 103 of transparent material, as is well known to persons skilled in the art. Thus, a polarization state of light passing through the line 103 can be altered.

Figure 5:
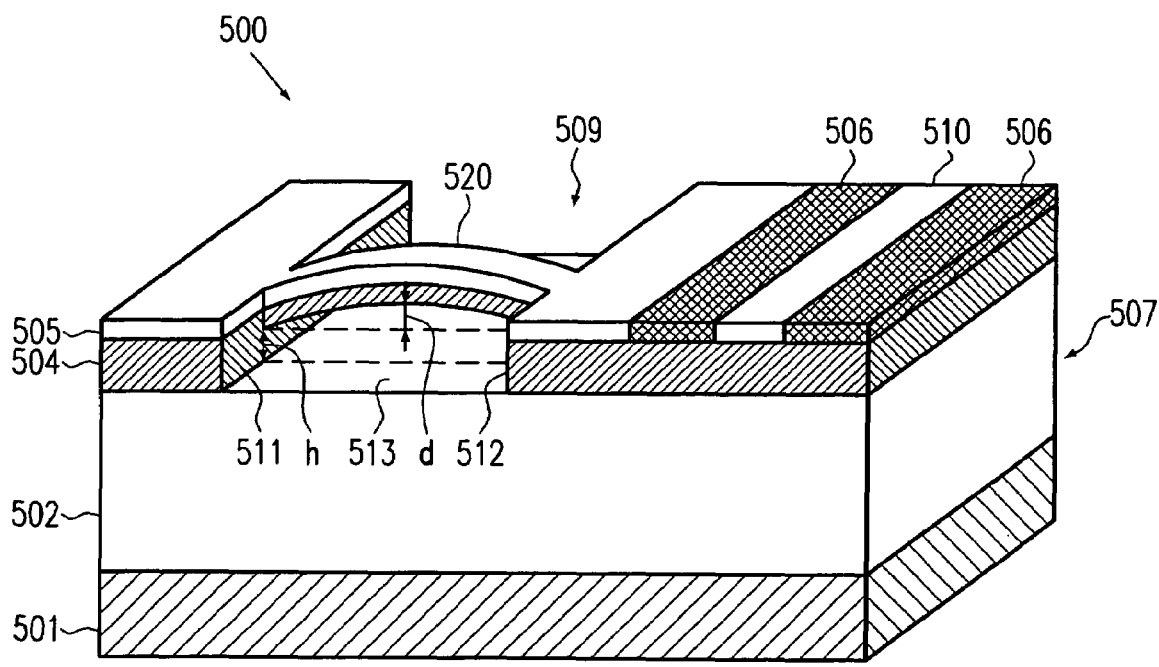
FIG. 5 shows a schematic view of a semiconductor structure according to an embodiment of the present invention.

FIG. 5 shows a semiconductor structure according to another embodiment of the present invention. The semiconductor structure 500 comprises a substrate 501 on which a layer structure 507 is formed. The layer structure 507 comprises a layer 502 of a first material, a layer 504 of a second material, and a layer 505 of a third material. Similar to the layer structure 107 in the semiconductor structure 100 described with reference to FIG. 1, the layer structure 507 comprises an electrical element provided in the form of an electrically conductive line 510 separated from other portions of the layer 505 by insulating portions 506. Alternatively, the electrically conductive element may be provided in the form of a field effect transistor.

Additionally, the semiconductor structure 500 comprises an elastic element 509. The elastic element 509 comprises a beam 520 spanning across a trench 513 and being fixed to sidewalls 511, 512 of the trench 513. The sidewalls 511, 512 are mounts providing a spacing h between the beam 520 and a bottom surface of the trench 513. The beam 520 comprises a portion of the layer 504 and a portion of the layer 505.

The beam 520 need not comprise two layers of materials. In other embodiments of the present invention, the beam 520 comprises only a single layer of a material or three or more layers.

If compressive stress is present in the layer structure 507, the beam 520 is subjected to forces acting from the sidewalls 511, 512 towards a center portion of the beam 520 which may lead to a deflection of the beam 520. The behavior of the beam 520 under the influence of the forces may be determined by means of the theory of elasticity known to persons skilled in the art. If the forces are small, the beam remains straight. Once the forces exceed a critical strength, the beam buckles. Then, the center portion of the beam is raised by a buckling height d. The buckling of the beam 520 and the buckling height d are representative of stress condition in the semiconductor structure 500. The stress in the semiconductor structure 500 can be calculated from the buckling height d.

The beam 520 in a semiconductor structure 500 according to the present invention need not be buckled upward, as shown in FIG. 5. In other embodiments of the present invention, the beam 520 can be buckled downward such that the central portions of the beam 520 have a smaller height above the bottom surface of the trench 513 than the portions adjacent the sidewalls 511, 512, corresponding to a negative value of the buckling height d.

If tensile strain is present in the semiconductor structure 500, the beam is subjected to forces acting towards the sidewalls 511, 512. These forces tend to stretch the beam 520. As the beam 520 is stretched, a stiffness of the beam 520 with respect to a force acting on the beam increases. Hence, the stiffness of the beam 520 is a property of the beam 520 representative of a stress condition in the semiconductor structure 500. The stress in the semiconductor structure 500 can be calculated from the stiffness of the beam 520 via the theory of elasticity.

Figure 7:
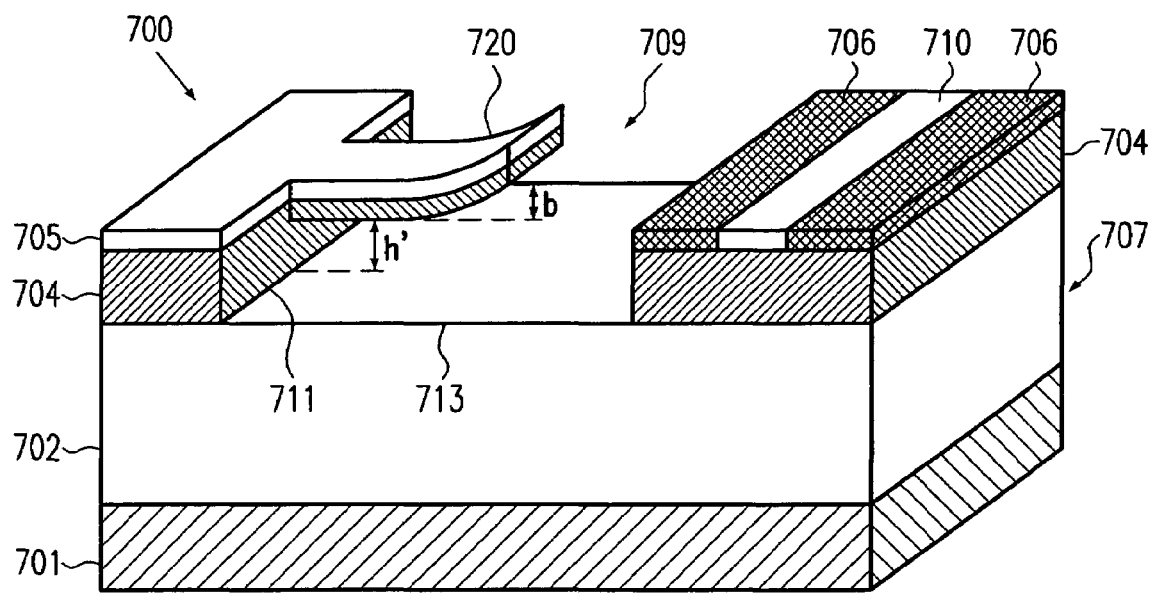
FIG. 7 shows a schematic view of a semiconductor structure according to an embodiment of the present invention.

FIG. 7 shows a semiconductor structure 700 according to another embodiment of the present invention. The semiconductor structure 700 comprises a substrate 701 on which a layer structure 707 comprising a layer 502 of a first material, a layer 504 of a second material, and a layer 505 of a third material is formed. The layer structure 707 can comprise an electrical element that may comprise an electrically conductive line 710 and insulating portions 706 separating the electrically conductive line 710 from other portions of the layer 705. In other embodiments of the present invention, the electrical element may comprise a field effect transistor.

The semiconductor structure 700 comprises an elastic element 709. The elastic element comprises a cantilever beam 720 provided over a trench 713 and being fixed to a sidewall 711 of the trench 713. The sidewall 711 is a mount providing a spacing h' between the cantilever beam 720 and a bottom surface of the trench 713. The beam comprises portions of the layer 704 and 705. If one or both of the layers 704, 705 are stressed, a deflection of the cantilever beam 720 comprising a bending of the cantilever beam 720 occurs. Due to the bending, a tip of the cantilever beam 720 is raised by a bending height b. The bending height b may be positive or negative, depending on whether the cantilever beam 720 is bent upward or downward.

A relation between the stress in the layers 704, 705 and the bending height b may be derived by means of the theory of elasticity known to persons skilled in the art. Hence, the bending of the cantilever beam 720 and the bending height b are properties of the elastic element representative of a stress condition in the semiconductor structure 700.

The present invention is not restricted to semiconductor structures comprising a single stress sensitive element. A semiconductor structure according to the present invention may comprise a plurality of stress sensitive elements. The stress sensitive elements can be substantially identical and arranged in different portions of the semiconductor structure. Thus, stresses in different portions of the semiconductor structures can be determined.

In other embodiments of the present invention, the semiconductor structure comprises different stress sensitive elements. For example, the semiconductor structure may comprise an array of beams similar to the beam 520 in the semiconductor structure 500 described above with reference to FIG. 5. The beams in the array may have different lengths or widths. As is well known to the skilled person, the critical stress for the buckling of a beam depends on the width and length of the beam, long and narrow beams have a lower critical stress than short and narrow beams. Thus, determining for each of a plurality of beams having different dimensions whether the beam is buckled allows information to be obtained about the strength of the strain, even if the buckling heights of the beams are not measured.

In still further embodiments of the present invention, the semiconductor structure can comprise a plurality of stress sensitive elements of different kinds. For example, the plurality of stress sensitive elements may comprise beams, cantilever beams and lines of transparent material. Thus, the stress in the semiconductor structure can be measured in a plurality of different ways. Advantageously, this allows more precise measurement of the stress.

Figure 2:
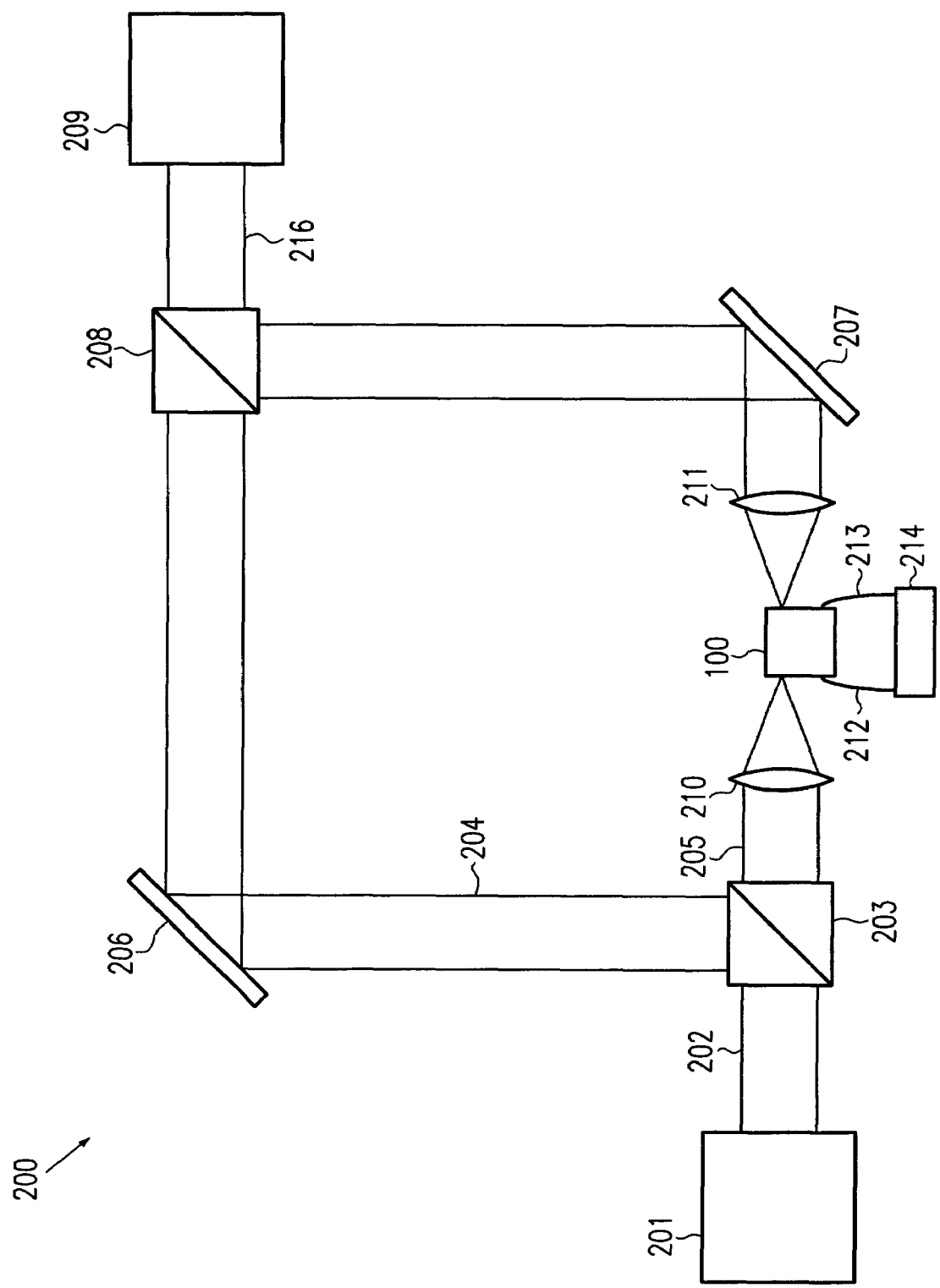
FIG. 2 shows a schematic sketch of a system for measuring a stress in a semiconductor structure according to an embodiment of the present invention.

FIG. 2 shows a system 200 for measuring a stress in a semiconductor structure according to one illustrative embodiment of the present invention. The system 200 comprises a semiconductor structure 100 as described above with reference to FIG. 1. Additionally, the system 200 comprises a light source 201 that may be, e.g., a laser. The light source 201 is adapted to emit a light beam 202. A first beam splitter 203 is adapted to split the light beam 202 into a first light beam portion 205 and a second light beam portion 204. An input coupler 210 is adapted to couple the first light beam portion 205 into the line 103 of transparent material in the semiconductor structure 100. The input coupler 210 may comprise a first focusing optical element that can comprise a lens. A focus of the first focusing optical element can be located at a first end of the line 103 of transparent material. An output coupler 211 is adapted to couple the first light beam 205 out of the line 103 of transparent material. Similar to the input coupler 210, the output coupler 211 can comprise a second focusing optical element that may comprise a lens. A focus of the second focusing optical element can be located at a second end of the line 103 of transparent material.

A first mirror 207 is adapted to reflect the first light beam portion 205 towards a second beam splitter 208. A second mirror 206 is adapted to reflect the second light beam portion 204 towards the second beam splitter 208.

In the second beam splitter 208, the first light beam portion 205 is unified with the second light beam portion 204 to form a unified light beam 216. The first light beam portion 205 and the second light beam portion 204 interfere with each other. Thus, the first beam splitter 203, the first mirror 207, the second mirror 206, and the second beam splitter 208 together form an interferometer.

A light detector 209 is adapted to measure an intensity of the unified light beam 216. An intensity of the unified light beam 216 depends on the length of the optical path of light passing through line 103 of transparent material since, depending on the length of the optical path, a phase difference between the first light beam portion 205 and the second light beam portion 204 is altered. Thus, an alteration of the length of the optical path of light in the line 103 of transparent material may be determined from an alteration of the intensity of the unified light beam 216 measured by the light detector 209. Hence, the interferometer, the light source 201 and the light detector 209 form a first analyzer adapted to determine the length of the optical path of the light in the line 103 of transparent material.

Additionally, the system 200 can comprise a second analyzer 214. A first wire 212 and a second wire 213 provide electrical contact between the second analyzer and the electrical element in the semiconductor structure 100.

In an embodiment of the present invention, wherein the electrical element comprises an electrically conductive line 110, the second analyzer 214 may comprise a power source and an ammeter adapted to measure an amperage of a current flowing through the electrically conductive line 110 and a voltmeter adapted to determine a voltage provided by the power source. Thus, using Ohm's law, a resistance of the electrically conductive line 110, which may also include contributions of a contact resistance between the electrically conductive line 110 and another structural element in the semiconductor structure 100, can be determined.

In an embodiment of the present invention wherein the semiconductor structure 100 comprises a field effect transistor, the second analyzer 214 may additionally comprise a second power source and a third wire providing electrical contact between a gate electrode of the field effect transistor and the second power source. The first and the second wire are configured to provide electrical contact between the power source and the source and drain region of the field effect transistor, respectively. A voltage provided by the second power source may be used to bring the channel region of the field effect transistor into an electrically conductive state. The ammeter, the voltmeter, and the power source may be used to determine the electrical resistance of the channel region of the field effect transistor from which the mobility of charge carriers in the channel region can be calculated.

In other embodiments of the present invention, the second analyzer 214 and the wires 212, 213 may be omitted. In such an embodiment, the semiconductor structure 100 need not comprise an electrical element.

In further embodiments of the present invention, the interferometer may comprise optical fibers instead of the first and second beam splitters 203, 208 and the first and second mirrors 206, 207. A first split optical fiber is connected to the light source 201 and adapted to split the light beam 202 into the first light beam portion 205 and the second light beam portion 204. A first end of the first split optical fiber comprising the first light beam portion 205 is connected to the first end of the line 103 of transparent material, e.g., by gluing the first end of the first split optical fiber to the semiconductor structure 110. Thus, the first end of the first split optical fiber forms an input coupler adapted to couple light emitted by the light source 201 into the line 103 of transparent material. A first end of a second split optical fiber is connected to the second end of the line 103 of transparent material, thus forming an output coupler adapted to couple light out of the line 103. The second ends of the first and the second optical fiber are connected with each other. Thus, the second split optical fiber is adapted to unify the first light beam portion 205 and the second light beam portion 204 to form the unified light beam 216. The second split optical fiber is connected to the light detector 209.

Figure 4:
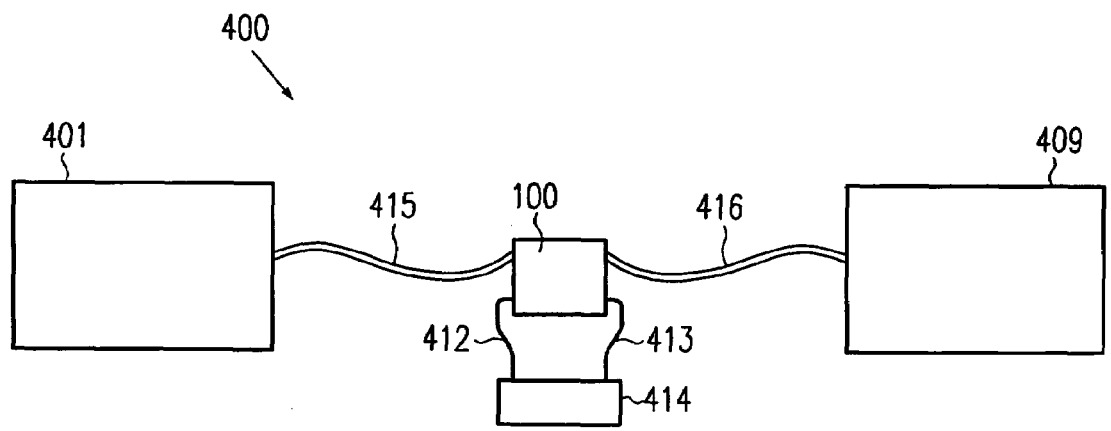
FIG. 4 shows a schematic sketch of a system for measuring a stress in a semiconductor structure according to an embodiment of the present invention.

FIG. 4 shows a system 400 for measuring a stress in a semiconductor structure according to another embodiment of the present invention. The system 400 comprises a semiconductor structure 100 as described above with reference to FIG. 1. Additionally, the system 400 comprises a light source 401 and a light detector 409. A first optical fiber 414 connects the light source 401 with the semiconductor structure 100 and is adapted to provide light emitted by the light source 401 to the line 103 of transparent material in the semiconductor structure 100. A second optical fiber 416 connects the semiconductor structure 100 with the light detector 409 and provides light transmitted through the line 103 of transparent material to the light detector 409. The light source 401, the light detector 409, and the first and the second optical fibers 415, 416 together form an analyzer adapted to determine an optical property of the line 103 of transparent material.

Additionally, the system 400 may comprise a second analyzer 414 adapted to determine a property of an electrical element in the semiconductor structure 100 similar to the second analyzer 214 in the system 200 described with reference to FIG. 2. The second analyzer 414 can be connected to the electrical element by means of wires 412, 413.

The light detector 409 can comprise a spectrometer. Thus, the analyzer is adapted to determine a spectrum of the light transmitted through the line 103 of transparent material. A light detector comprising a spectrometer is particularly advantageous if the line 103 of transparent material in the semiconductor structure 100 comprises a grating region. In such an embodiment of the present invention, the light source 401 can be configured to emit light having a plurality of wavelengths. In particular, the light source 401 can be adapted to emit light having a continuous band of wavelengths in the vicinity of the characteristic wavelength of the grating region in the absence of strain in the semiconductor structure 100.

The spectrum of the transmitted light comprises a minimum at the characteristic wavelength of the grating region, which is representative of the stress in the semiconductor structure 100. Thus, the stress in the semiconductor structure 100 can be determined from the position of the minimum in the spectrum.

In other embodiments of the present invention, the system 400 comprises a branched optical fiber instead of the optical fibers 415 and 416. Similar to the optical fiber 415, the branched optical fiber is connected to the line 103 of transparent material in the semiconductor structure 100. A first end of the branched optical fiber is connected to the light source 401. A second end of the branched optical fiber is connected to the light detector 409. Thus, the branched optical fiber guides light from the light source 401 to the line 103 of transparent material and guides light reflected in the line 103 to the light detector 409. Thus, the analyzer is adapted to determine a spectrum of light reflected in the line 103 of transparent material. The spectrum comprises a peak at the characteristic wavelength of the grating region in the line 103. The stress in the semiconductor structure 100 may be calculated from the position of the peak in the spectrum.

In other embodiments of the present invention, the light source 401 is adapted to emit polarized light having a first polarization direction. Alternatively, the light source can be adapted to emit unpolarized light and a first polarization filter adapted to transmit light being polarized in the first polarization direction may be provided between the light source 401 and the first optical fiber 415 or between the first optical fiber 415 and the semiconductor structure 100. Thus, polarized light having a predetermined polarization direction is coupled into the line 103 of transparent material.

The light detector 409 is adapted to detect an intensity of light transmitted through the semiconductor structure 100 and having a second polarization direction. To this end, the light detector may comprise a light sensor adapted to detect a light intensity provided with a second polarization filter. Alternatively, the second polarization filter can be provided between the semiconductor structure 100 and the second optical fiber 416. Thus, the analyzer is adapted to detect polarization properties of the light transmitted through the line 103 of transparent material.

An analyzer adapted to detect polarization properties is particularly advantageous if the property of the line 103 of transparent material being representative of the stress in the semiconductor structure 100 comprises a birefringence of light in the transparent material.

To detect a birefringence of light in the line 103 of transparent material, the first and the second polarization direction can be perpendicular to each other. In the absence of birefringence in the transparent medium, the second polarization filter substantially blocks any light transmitted through line 103. If, however, the transparent material is birefringent, the polarization properties of the transmitted light are altered and a fraction of the transmitted light passes through the second polarization filter. The intensity of the light passing through the second filter measured by the light detector is representative of the stress in the semiconductor structure 100.

In further embodiments of the present invention, the system 400 comprises an input coupler comprising a first focusing element and being adapted to couple light emitted by the light source 401 into the line 103 of transparent material and an output coupler comprising a second focusing element and being configured to couple light out of the line 103 of transparent material instead of the optical fibers 415, 416. The first focusing element and the second focusing element can each comprise a lens.

Figure 8:
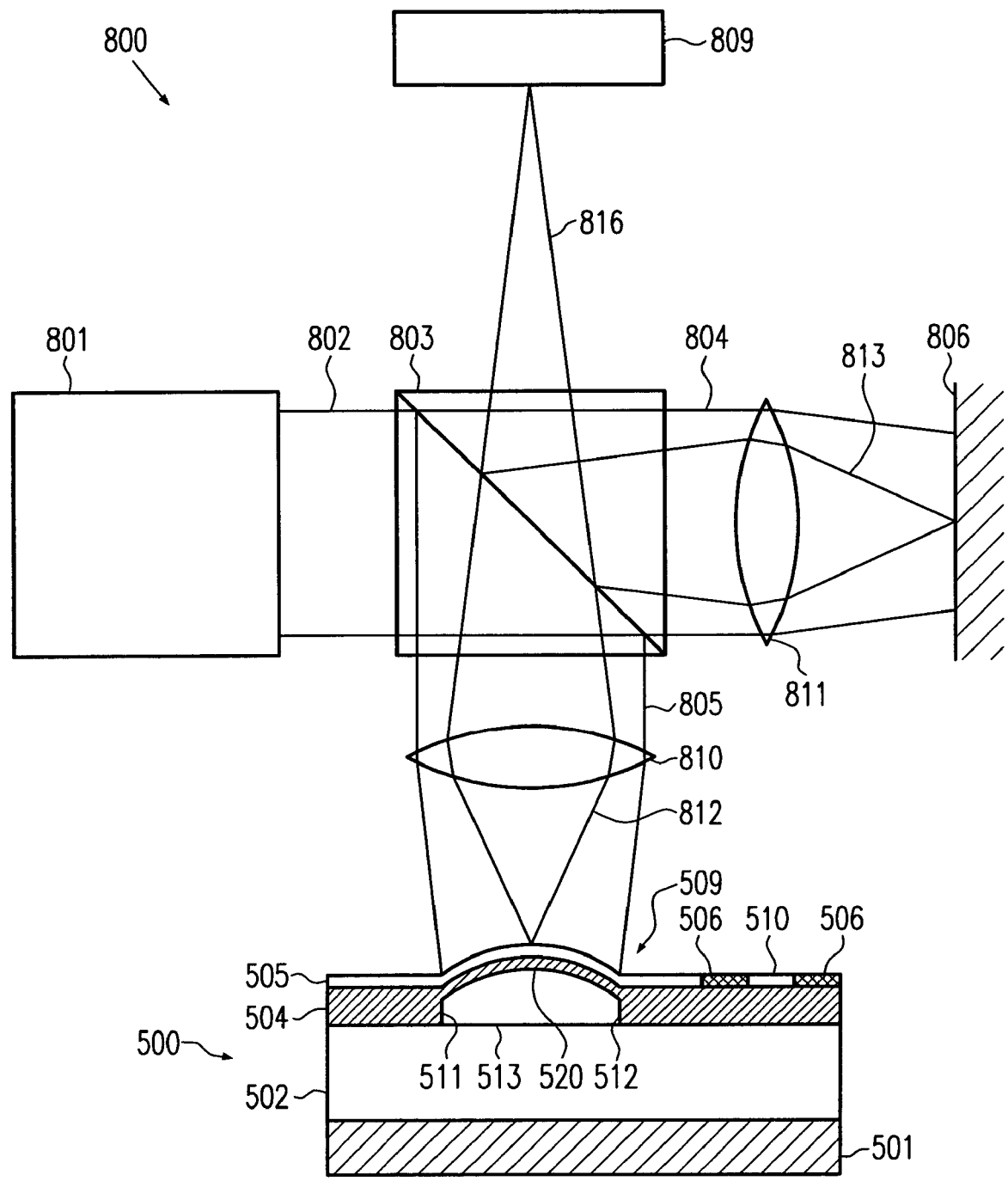
FIGS. 8-10 show sketches of systems for measuring a stress in a semiconductor structure according to embodiments of the present invention.

FIG. 8 shows a system 800 for measuring a stress in the semiconductor structure according to yet another embodiment of the present invention. The system 800 comprises a semiconductor structure 500 as described with reference to FIG. 5. Additionally, the system 800 comprises a light source 801 adapted to emit a light beam 802. A beam splitter 803 is adapted to split the light beam 802 into a first light beam portion 805 and a second light beam portion 804.

A first focusing element 810, which may comprise a lens, is provided between the beam splitter 803 and the semiconductor structure 500. The first light beam portion 805 passes the first focusing element and impinges on the semiconductor structure 500. A second focusing element 811, which may comprise a lens, is provided between the beam splitter 803 and a reference surface 806. The reference surface 806 can be planar. The second light beam portion 804 passes the second focusing element and impinges on the reference surface 806.

The first light beam portion 805 is reflected from the semiconductor structure 500. A first reflected light 812 reflected from a surface of the beam 520 passes the first focusing element 812 and the beam splitter 803 towards a light detector 809. Similarly, the second light beam portion 804 is reflected from the reference surface 806. A second reflected light 813 reflected from the reference surface 806 is reflected towards the light detector 809 in the beam splitter 803. In the beam splitter 803, the first reflected light 812 and the second reflected light 813 interfere with each other and form a unified light beam 816. Thus, the beam splitter 803, the first focusing element 810, the second focusing element 811 and the reference surface 806 together form an interferometer. The light detector 809 is adapted to measure an intensity of the unified light beam 816.

The first focusing element 810 and the second focusing element 811 can be adapted such that the beam 520 and the reference surface 806 are imaged on the light detector 809. Thus, a superposition of an image of the beam 520 and an image of the reference plane 806 is formed at the location of the light detector 809. The light detector 809 can comprise a two-dimensional sensor configured to record the superposition of the images of the beam 520 and the reference plane 806. In particular embodiments of the present invention, the detector 809 can comprise a charge coupled device or a photographic film.

An intensity of the unified light beam 816 is representative of a phase difference between the first reflected light 812 and the second reflected light 813. The phase difference is representative of a height profile of the beam 520. If the beam 520 is buckled, the height profile of the beam 520 obtains a curved shape, a central portion having a height greater than a height of peripheral portions of the beam 520 adjacent the sidewalls 511, 512. A height difference between the central portion and the peripheral portions is substantially equal to the buckling height d being a property of the beam 520 representative of the stress in the semiconductor structure 500.

Thus, the stress in the semiconductor structure 500 can be determined from an analysis of the intensity of the unified light beam 816 measured by the detector 809.

In other embodiments of the present invention, the system 800 comprises a semiconductor structure 700, as described above with reference to FIG. 7, instead of the semiconductor structure 500. The first beam portion 805 impinges on the semiconductor structure 700 and the first reflected light 812 is reflected from a surface of the cantilever beam 720. Thus, a height profile of the cantilever beam 720 and hence a bending of the cantilever beam 720 can be determined from the analysis of the light intensity of the unified beam 816 measured by the detector 809.

Figure 9:
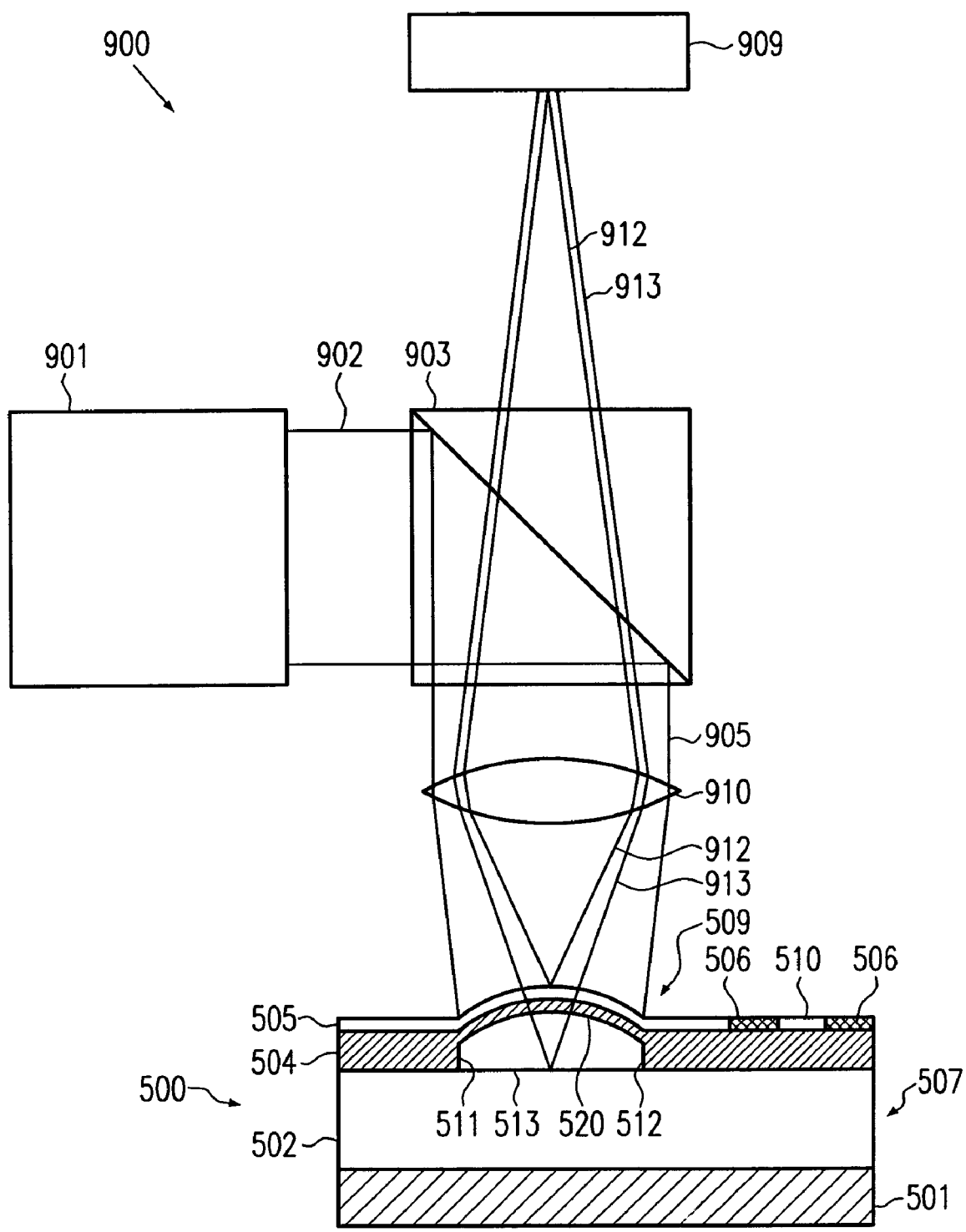

FIG. 9 shows a system 900 for measuring a stress in a semiconductor structure according to another embodiment of the present invention. The system 900 comprises a semiconductor structure 500 as described above with reference to FIG. 5. Additionally, the system comprises a light source 901 adapted to emit a light beam 902. A beam splitter 903 reflects a portion 905 of the light beam 902 towards the semiconductor structure 500. The portion 905 passes a first focusing element 910 provided between the beam splitter 903 and the semiconductor structure 500. The first focusing element 910 may comprise a lens. Subsequently, the portion 905 impinges on the semiconductor structure 500 and is reflected at least partially by the semiconductor structure 500. In this embodiment of the present invention, the beam 520 has some transparency such that a portion of a light impinging on the beam 520 is transmitted through the beam 520.

A first reflected light 912 is reflected from the surface of the beam 520 and passes the focusing element 910 and the beam splitter 903. A second reflected light 913 is reflected from the bottom surface of the trench 513 and passes the focusing element 910 and the beam splitter 903. The first reflected light 912 and the second reflected light 913 impinge on a light detector 909.

The focusing element can be adapted such that the beam 520 and the trench 513 are imaged on the detector 909. Thus, an image of the semiconductor structure 500 is formed on the detector 909. Similar to the light detector 809 in the embodiment described with reference to FIG. 8, the light detector 909 can comprise a two-dimensional sensor configured to record the image of the semiconductor structure 500.

The first reflected light 912 and the second reflected light 913 interfere with each other. Thus, the beam splitter 903 and the focusing element 910 together form an interferometer. A light intensity recorded by the light detector 809 is representative of a phase difference between the first reflected light 912 and the second reflected light 913, which, in turn, is representative of a profile of the beam 520 being representative of a stress condition in the semiconductor structure 500.

Thus, the stress in the semiconductor structure 500 can be determined from an analysis of the light intensity measured by the light detector 909.

In other embodiments of the present invention, the system 900 comprises a semiconductor structure 700 as described above with reference to FIG. 7 instead of the semiconductor structure 500.

The portion 905 of the light beam 902 is reflected towards the semiconductor structure 700 and impinges on the semiconductor structure 700. The first reflected light 912 is reflected from a surface of the cantilever beam 720. The second reflected light 913 is reflected from the bottom surface of the trench 713. The first reflected light 912 and the second reflected light interfere with each other, such that a light intensity recorded by the light detector 809 is representative of the height profile of the cantilever beam 720. Thus, the bending of the cantilever beam 720 and the bending height b can be determined from the recorded light intensity.

In the systems for measuring a stress in a semiconductor substrate described above, the property of the stress sensitive element representative of the stress condition in the semiconductor structure is determined in a non-contact mode by optical means. In other embodiments, however, the property of the stress sensitive element can be determined by various contact methods.

A system for measuring a stress in a semiconductor structure can comprise an atomic force microscope. An atomic force microscope, known to persons skilled in the art, comprises a tip provided at the end of a cantilever. If the tip is brought into a close proximity of a sample, a force between the sample and the tip leads to a deflection of the cantilever, which may be detected by known means. A feedback mechanism is employed to adjust the distance between the tip and the sample such that the force is substantially constant as the surface of the sample is scanned with the tip. The feedback mechanism may comprise a piezoelectric element adapted to adjust a distance between the tip and the sample. Thus, a height profile of the sample can be determined.

The system can comprise a semiconductor structure 500 as described above with reference to FIG. 5. The height profile of the beam 520 can be scanned with the atomic force microscope. The deflection of the beam 520 and the buckling height d can be determined from the height profile. The stress in the semiconductor structure 500 can be calculated from the height profile and/or the buckling height d.

In another embodiment of the present invention, the system comprises a semiconductor structure 700 as described above with reference to FIG. 7. The height profile of the cantilever beam 720 can be scanned with the atomic force microscope, and the bending height b can be determined from the height profile. The stress in the semiconductor structure can be calculated from the height profile and/or the bending height b.

In a system for measuring a stress in a semiconductor structure comprising an atomic force microscope, the atomic force microscope can be adapted to apply a force to an elastic element. To this end, a piezoelectric element can be activated to reduce a distance between the elastic element and the tip, wherein the distance can be smaller than the distance used in the scanning of the elastic element. This may lead to a deflection of the elastic element. The deflected elastic element exerts a force to the cantilever of the atomic force microscope. A strength of the force is representative of a stiffness of the elastic element.

In an embodiment of the present invention, the system comprises a semiconductor structure 500 as described above with reference to FIG. 5. The atomic force microscope is adapted to apply a force to the beam 520, thus being adapted to determine a stiffness of the beam 520 being representative of a stress condition in the semiconductor structure 500.

In other embodiments of the present invention, the semiconductor structure 500 can comprise a membrane instead of the beam 520. In addition to the sidewalls 511, 512, the membrane can be fixed to a third sidewall provided at a side of the beam 520. Thus, the semiconductor structure 500 can comprises a cavity between the membrane and the layer 502. Similar to the beam 520, the membrane can comprise portions of the layers 504, 505. If a compressive stress is present in the semiconductor structure 500, the membrane is deflected, namely arched in an upward direction away from the substrate 501. If a tensile stress is present in the semiconductor structure 500, a stiffness of the membrane increases. Thus, the arching of the membrane and the stiffness of the membrane are properties of the membrane being representative of a stress condition in the semiconductor structure 500.

Figure 10:
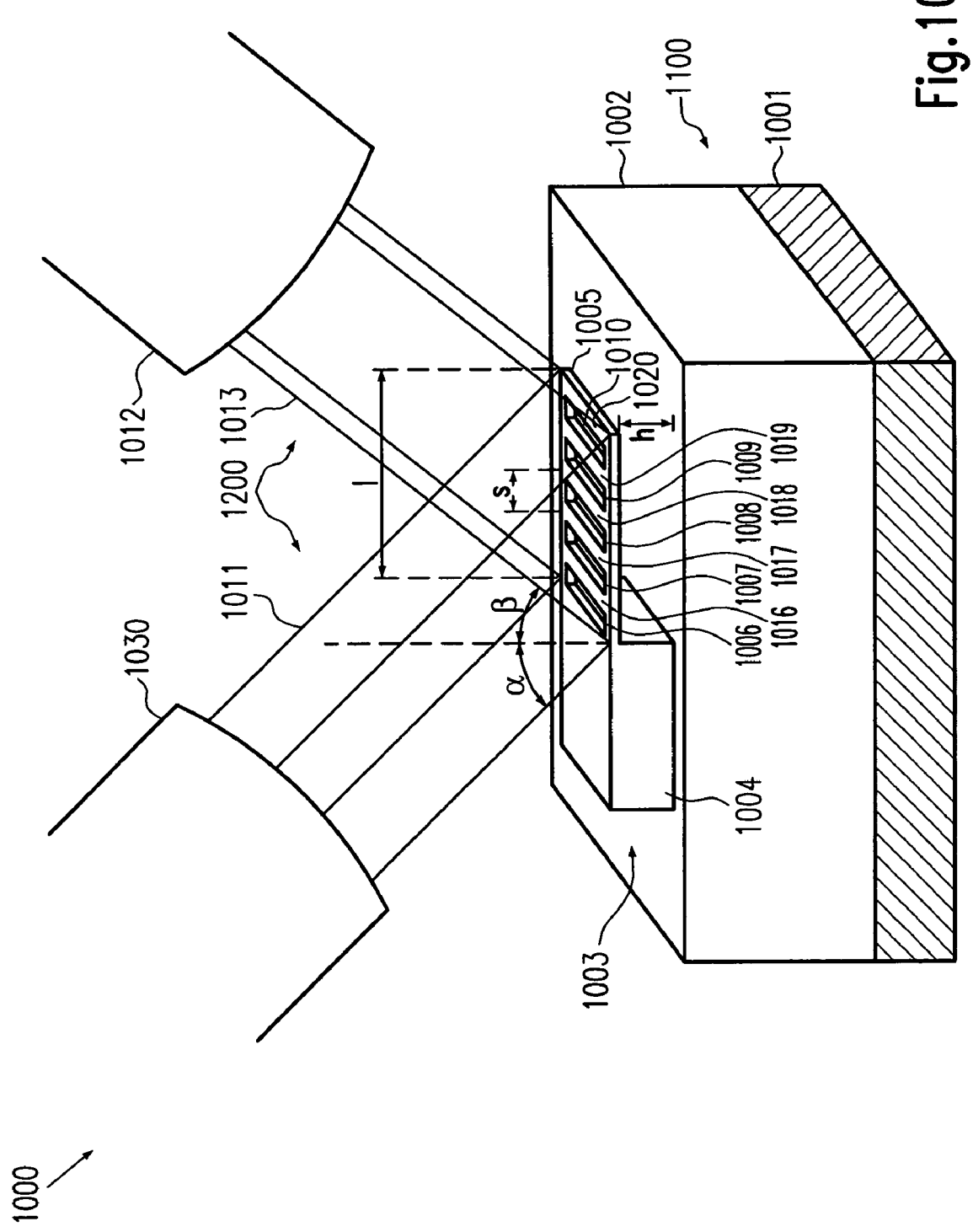

FIG. 10 shows a system 1000 for measuring a stress in the semiconductor structure according to yet another illustrative embodiment of the present invention. The system 1000 comprises a semiconductor structure 1001. The semiconductor structure 1001 comprises a layer 1002 of a first material formed on a substrate 1001. On the layer 1002, a stress sensitive element 1003 is formed. The stress sensitive element 1003 comprises an elastic element provided in the form of a grating 1005 having a plurality of trenches 1006-1010. Between the trenches 1006-1010, lines 1016-1020 are provided. The grating 1005 has a length l. Adjacent trenches have a spacing s. The trenches 1006-1010 can have a depth smaller than a thickness of the grating 1005. In other embodiments of the present invention, the trenches 1006-1010 extend through the grating 1005. Additionally, the stress sensitive element 1003 comprises a mount 1004 configured to provide a spacing h between the grating 1005 and the layer 1002.

If the grating 1005 is subjected to a stress having a component in a plane of the grating 1005 and substantially perpendicular to a direction of the grooves 1006-1010 (indicated by arrow 1050 in FIG. 10), the length l of the grating is increased or decreased, depending on whether the stress is tensile or compressive. Pursuant to the alteration of the length l, the spacing s between the trenches 1006-1010 is also altered. Thus, the length l and the spacing s are properties of the stress sensitive element 1003 representative of a stress condition in the semiconductor structure 1100.

In addition to the semiconductor structure 1100, the system 1000 comprises a diffractometer. The diffractometer 1200 comprises a light source 1040 and a light detector 1012. The light source 1040 is adapted to emit a light beam 1011 impinging on the grating 1005. A direction of the light beam 1011 has an angle α to a direction perpendicular to a surface of the grating 1005. At each of the lines of the grating 1005, a light portion from the light beam 1011 is scattered.

The detector 1012 is arranged such that light scattered in a direction including an angle β with a direction perpendicular to a surface of the grid 1005 reaches the detector 1012. The detector 1012 is adapted to measure an intensity of the light scattered from the grid 1005 towards the detector 1012.

The light portions scattered at the lines 1016-1020 interfere with each other. If an optical path difference between light portions scattered from adjacent lines is substantially equal to an integer multiple of a wavelength of the light in the light beam 1011, the interference is constructive and the light intensity received by the detector 1012 is high. Otherwise, the interference is destructive and the light intensity received by the detector 1012 is low. The optical path difference depends on the angles α, β and the spacing s between adjacent lines of the grid 1005.

For a particular angle α between the direction of the light beam 1011 and the direction perpendicular to the surface of the grating 1005, the light intensity measured by the detector 1012 has a maximum at a value of the angle β representative of the spacing s between the lines 1016-1020. Hence, by measuring the angle β at which the scattered light intensity has a maximum, the spacing s can be determined. Thus, the diffractometer 1012 is adapted to determine the spacing s representative of the stress condition in the semiconductor structure 1100.

In other embodiments of the present invention, the system 1000 can comprise a microscope. The length l of the grating 1005 and/or the spacing s between the trenches 1006-1010 can be measured from a microscopic image of the grating 1005. The microscope can comprise an optical microscope allowing an optical investigation of the properties of the stress sensitive element 1003, an electron microscope, in particular a scanning electron microscope, or an atomic force microscope.

In addition to the stress sensitive element 1003, the semiconductor structure 1100 may comprise an electrical element. The electrical element can comprise an electrically conductive line similar to the electrically conductive lines 110, 510, 710 in the embodiments of the present invention described with reference to FIGS. 1, 5 and 7. In other embodiments of the present invention, the semiconductor structure 1100 can comprise an electrical element comprising a field effect transistor.

In addition to the diffractometer 1200, the system 1000 can comprise an analyzer adapted to measure a property of the electrical element. If the electrical element comprises an electrically conducive line, the analyzer can be adapted to measure an electrical resistance of the electrically conductive line. If the electrical element comprises a field effect transistor, the analyzer can be adapted to measure a mobility of charge carriers in the channel region of the field effect transistor.

Methods for adjusting a manufacturing process for a semiconductor structure and for investigating the influence of stress on an electrical element in a semiconductor structure according to an embodiment of the present invention will be described in the following.

A first semiconductor structure is formed by means of a first manufacturing process. The first semiconductor structure can be a semiconductor structure 100 as described above with reference to FIG. 1. In the manufacturing process, first the substrate 100 is provided. Then, the layer 102 of the first material is deposited on the substrate 101. This can be done by means of deposition techniques known to persons skilled in the art, such as physical vapor deposition, chemical vapor deposition, and/or plasma enhanced chemical vapor deposition.

The line 103 of transparent material is formed in the first semiconductor structure 100. To this end, a trench is form ed in the layer 102, which can be done by means of photolithography techniques and etching techniques known to persons skilled in the art. Then, a layer of a transparent material is deposited on the semiconductor structure 100. A polishing process is performed to planarize the semiconductor structure 100 and to remove portions of the layer of transparent material outside the trench. The polishing process may comprise chemical mechanical polishing.

Figure 3:
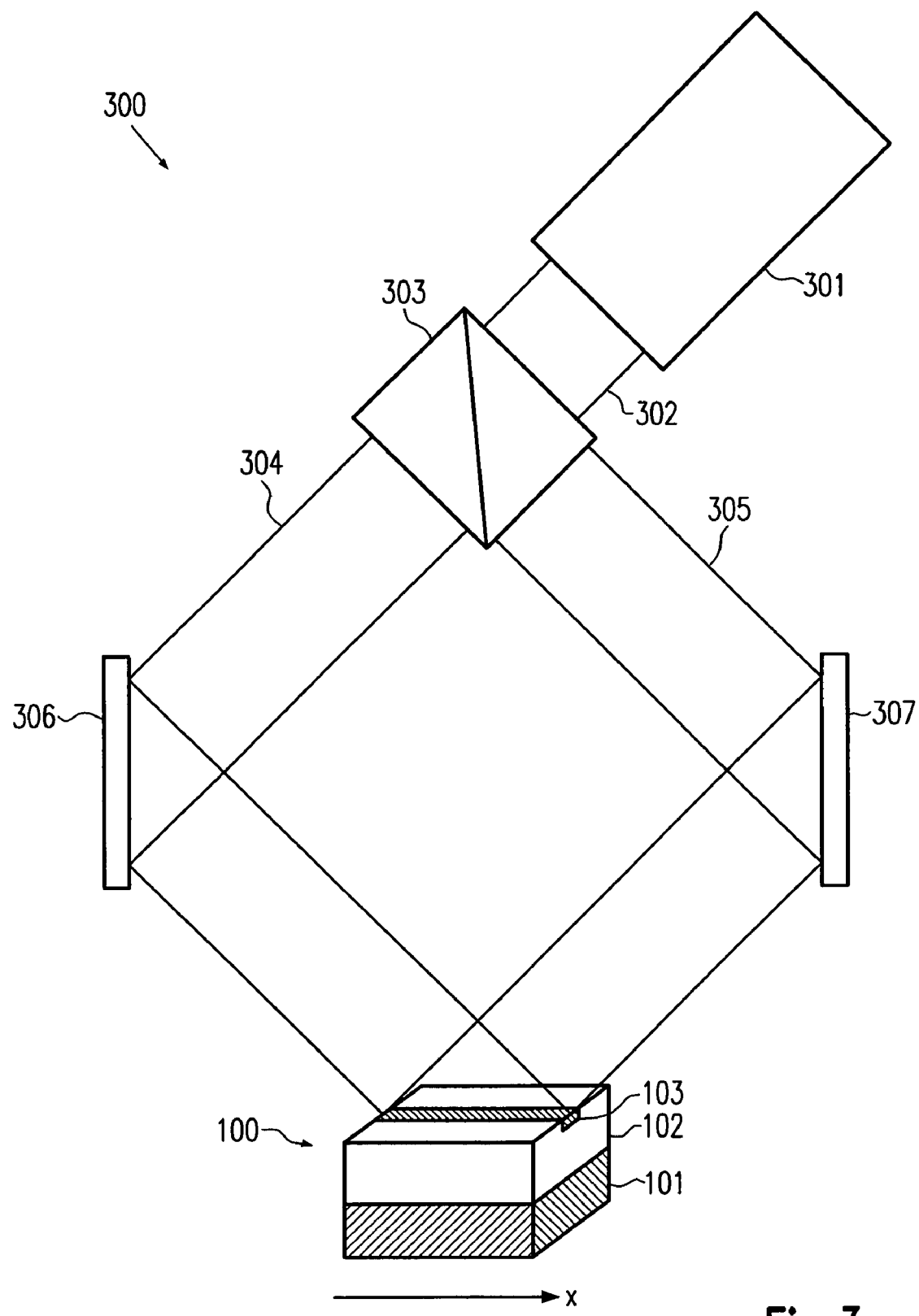
FIG. 3 shows a schematic sketch of a laser apparatus for forming a stress sensitive element in a semiconductor structure according to an embodiment of the present invention.

In some embodiments of the present invention, a grating region is formed in the line 103 of transparent material, as will be described with reference to FIG. 3. Forming the grating region can comprise splitting a laser beam 302 emitted by a laser 301 into a first light beam portion 304 and a second light beam portion 305. This can be done by means of a beam splitter 303. The laser beam 302 can comprise ultraviolet light. The first light beam portion 304 is reflected towards the first semiconductor structure by a first mirror 306. The second light beam portion 305 is reflected towards the first semiconductor structure 100 by a second mirror 307. At the semiconductor structure 100, the first light beam portion 304 and the second light beam portion 305 interfere with each other. A phase difference between a light in the first light beam portion 304 and a light in the second light beam portion 305 reaching a particular zone in the line 103 of transparent material depends on the location of the zone in the longitudinal direction x of the line 103. Thus, along line 103, zones where the first and the second light beam portions interfere constructively and zones at which the first and second light beam portions interfere destructively alternate with each other. Zones of constructive interference receive a high intensity of light. In these zones, the index of refraction of the transparent material is increased, which may be explained with the breaking of chemical bonds in the transparent material by energetic photons. Thus, zones having a higher index of refraction are created. Zones of destructive interference receive only a low intensity of light. In these zones, the index of refraction of the transparent material remains substantially unaltered.

The manufacturing process further comprises depositing the layer 104 of the second material and the layer 105 of the third material shown in FIG. 1 over the layer 102. This may be done by means of known deposition techniques.

An electrical element can be formed in the first semiconductor structure 100. In one embodiment of the present invention, the electrical element can comprise an electrically conductive line 110, which may be formed by means of a damascene technique, as will be described in the following. Before the deposition of the layer 105, insulating portions 106 are formed over the layer 104. This may be done by means of photolithography techniques known to persons skilled in the art. In other embodiments of the present invention, the insulating portions 106 can be formed in the layer 104. To this end, portions of the layer 104 outside the insulating portions 106 are thinned, which may be done by means of photolithography techniques and etching techniques known to persons skilled in the art. The material loss in the layer 104 may be taken into account in advance by correspondingly increasing the thickness of the layer 104 deposited on the semiconductor structure 100. After deposition of the layer 105 of the third material, a polishing process is performed to remove excess third material from the insulating portion 106 and to planarize the surface of the semiconductor structure 100.

Figure 6A:
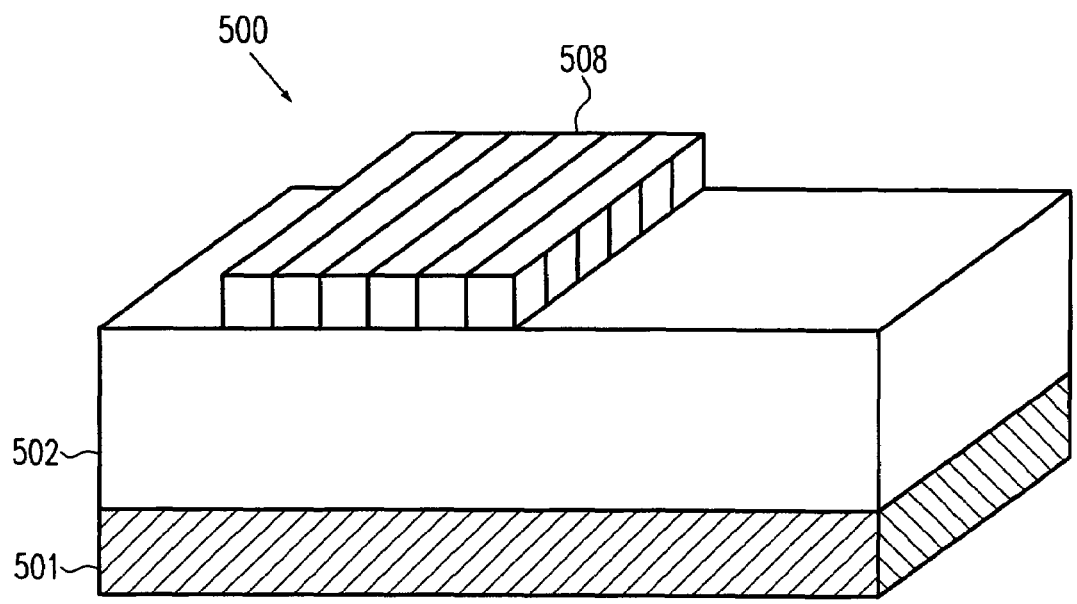
FIGS. 6a-6c show stages in the manufacturing of a semiconductor structure according to an embodiment of the present invention.

In other embodiments of the present invention, the first semiconductor structure is a semiconductor structure 500 as described above with reference to FIG. 5. FIG. 6a shows the semiconductor structure 500 in a first stage of the manufacturing process. In the manufacturing process, first the layer 502 is deposited on the substrate 501. Forming the stress sensitive element 509 comprises forming a sacrificial layer 508 on the layer 502. This may be done using known deposition and patterning techniques.

Figure 6B:
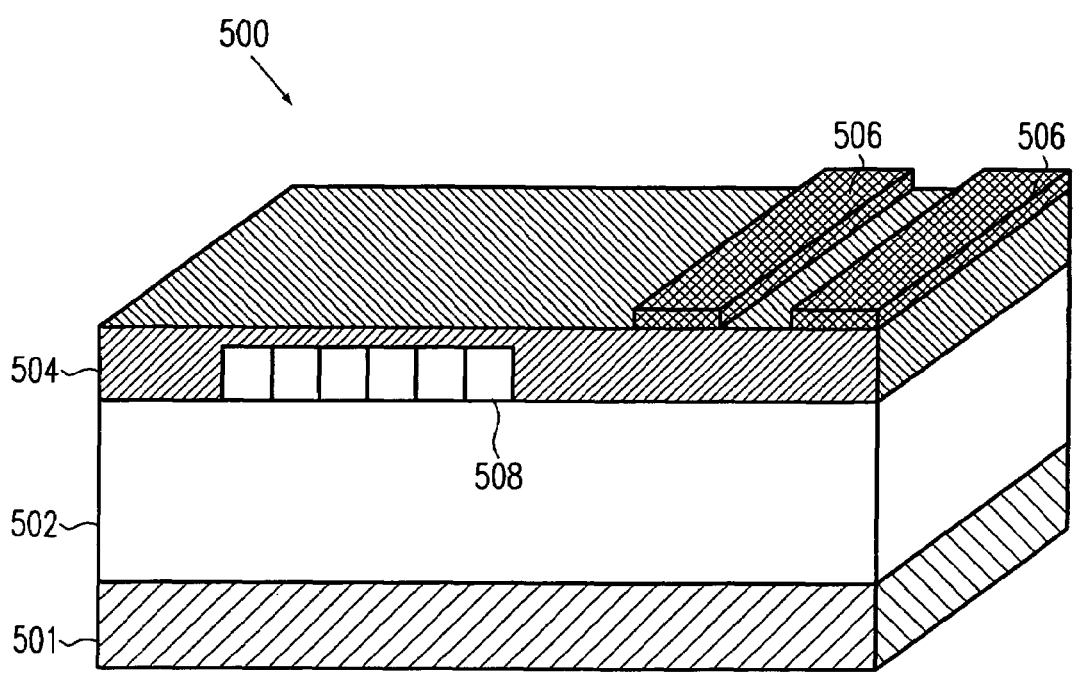

FIG. 6b shows the semiconductor structure 500 in a later stage of the manufacturing process. The manufacturing process further comprises depositing the layer 504 on the semiconductor structure 500. Since a thickness of a portion of the layer 504 deposited on the sacrificial layer 508 and a thickness of a portion of the layer 504 deposited on the layer 502 are substantially equal, a surface of the layer 504 comprises a bump above the sacrificial layer 508. A polishing process, which can be a chemical mechanical polishing process, may be performed to remove the bump and to obtain a planar surface of the layer 504.

An electrical element provided in the form of the electrically conductive line 510 can be formed in the semiconductor structure 500. To this end, insulating portions 506 are formed on the layer 504. Similar to the formation of the insulating portions 106 in the method described with reference to FIGS. 1-4, the insulating portions can be formed by depositing a layer of an insulating material on the semiconductor structure 500 and patterning the same, or, alternatively, by thinning portions of the layer 504 other than the insulating portions 506.

Figure 6C:
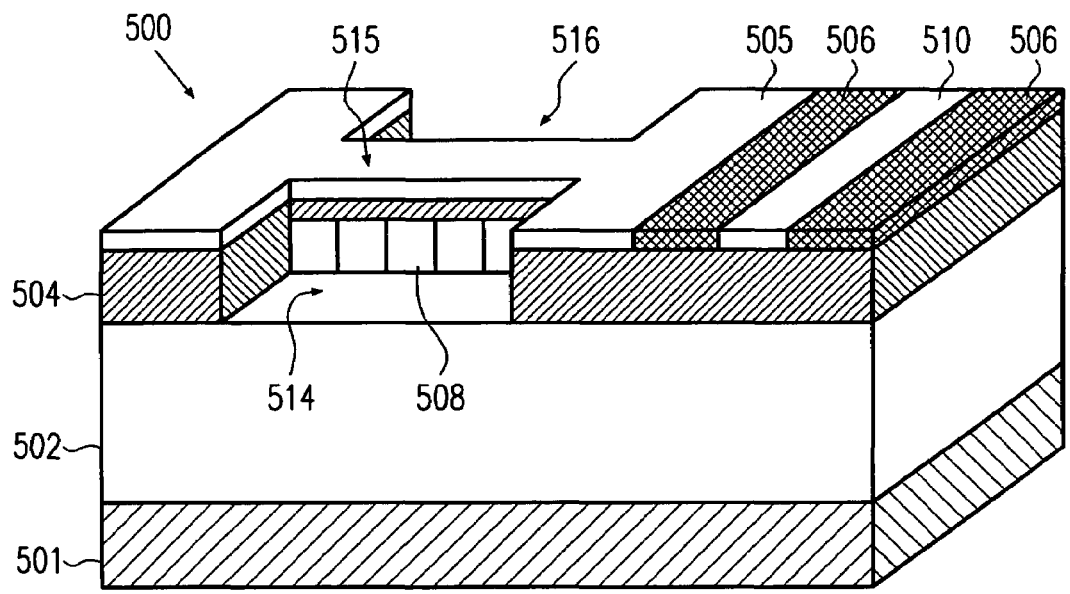

FIG. 6c shows the semiconductor structure 500 in a later stage of the manufacturing process. The manufacturing process comprises depositing the layer 505 of the third material on the semiconductor structure 500 and planarizing the layer 505 to obtain a planar surface of the layer 505 and to remove portions of the layer 505 over the insulating portions 506.

Subsequently, the formation of the stress sensitive element is continued by forming trench portions 514, 516 adjacent a beam precursor structure 515. To this end, the layers 504, 505 and the sacrificial layer 508 are patterned by removing portions of the layers 504, 505 and the sacrificial layer 508, which can be done by means of known photolithography and etching techniques. A bottom surface of the trench portions 514, 516 comprises a surface of the layer 502. The beam precursor structure 515 comprises portions of the layers 504, 505 over a residue of the sacrificial layer 508.

The residue of the sacrificial layer 508 is removed. This can be done by exposing the semiconductor structure 500 to an etchant adapted to selectively remove a material of the sacrificial layer 508, whereas the first, second, and third material of the layers 502, 504 and 505 and the material of the insulating portions 506 are substantially not affected by the etchant. As the residue of the sacrificial layer 508 is removed, the trench portions 514, 516 are connected with each other to form the trench 513 and the beam 520 spanning across the trench 513 (see FIG. 5) is formed from the portions of the layers 504, 505 in the beam precursor structure 515.

Thus, the semiconductor structure 500 as shown in FIG. 5 is obtained. If a stress is present in the semiconductor structure 500, forces act on the beam 520. A stress can be present due to residual stresses in the layers 504, 505 created in the deposition of the layers 504, 505, and resulting from an incompatibility of the crystal structure of the second material with the crystal structure of the third material. Stress may also result from different thermal coefficients of expansion of the materials in the substrate and the layers 502, 504 and 505. If the layers are deposited at elevated temperature, the materials in the layers will tend to shrink differently as the temperature is reduced. For example, if the substrate or the layer 502 has a greater thermal coefficient of expansion than the layers 504, 505, the layers 504, 505 will be compressed when the temperature is reduced after the deposition of the layers 504, 505. If a small compressive stress is present in the semiconductor structure 500, the beam 520 remains substantially straight. If, however, the compressive stress exceeds a critical stress, the forces exceed the critical strength and the beam 520 is buckled, as detailed above. A tensile stress in the semiconductor structure 500 will lead to an increased stiffness of the beam 520.

In an embodiment of the present invention wherein the semiconductor structure 500 comprises a membrane instead of the beam 520, the membrane can be formed similar to the formation of the beam 520. The layers 504, 505 are deposited over a sacrificial layer similar to the sacrificial layer 508. The layers 504, 505 and the sacrificial layer are patterned to form a trench portion adjacent a membrane precursor structure comprising portions of the layer 504, 505 over a portion of the sacrificial layer. Subsequently, the membrane is completed by etching away the portion of the sacrificial layer.

In other embodiments of the present invention, the first semiconductor structure is a semiconductor structure 700 as described above with reference to FIG. 7. The manufacturing of the first semiconductor structure 700 and the formation of the stress sensitive element 709 can be performed similar to the manufacturing of the first semiconductor structure 500 and the formation of the stress sensitive element 509. The formation of the stress sensitive element 709 comprises forming trench portions similar to the trench portions 514, 516 adjacent a cantilever beam precursor structure similar to the beam precursor structure 515. Additionally, a third trench portion intersecting the cantilever beam precursor structure is formed. A residue of a sacrificial layer similar to the sacrificial layer 508 separates portions of the layers 704, 705 form the layer 702. The semiconductor structure 700 is exposed to an etchant adapted to selectively remove a material of the sacrificial layer, whereas materials of other portions of the semiconductor structure 700 are substantially not affected by the etchant. Thus, the cantilever beam 720 and the trench 713 are formed.

In further embodiments of the present invention, the first semiconductor structure is a semiconductor structure 1100 as described above with reference to FIG. 10.

Figure 11A:
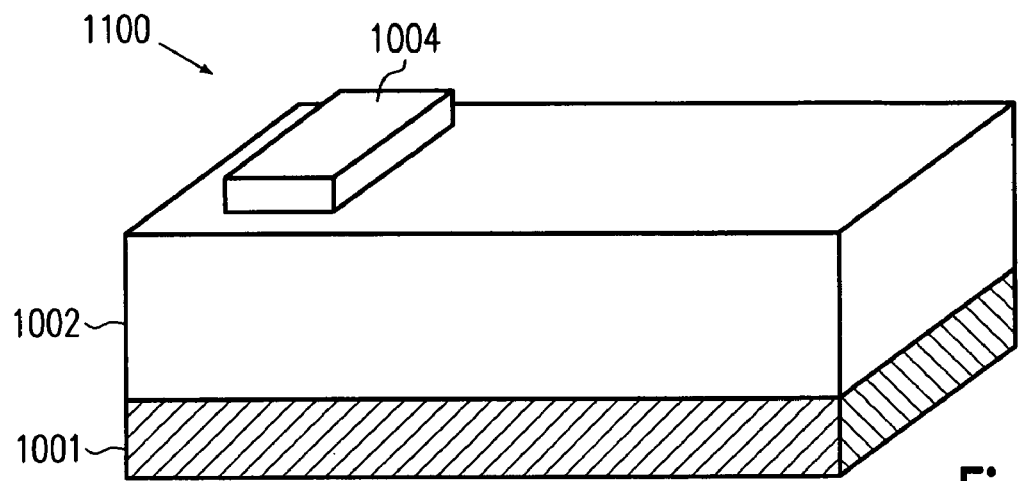
FIGS. 11a-11c show stages in the manufacturing of a semiconductor structure according to an embodiment of the present invention.

FIG. 11a shows the semiconductor structure 1100 in a first stage of the manufacturing process. The layer 1002 is deposited on the substrate 1001. Forming the stress sensitive element 1005 comprises forming the mount 1004 on the layer 1002, which may be done by means of known photolithography techniques.

Figure 11B:
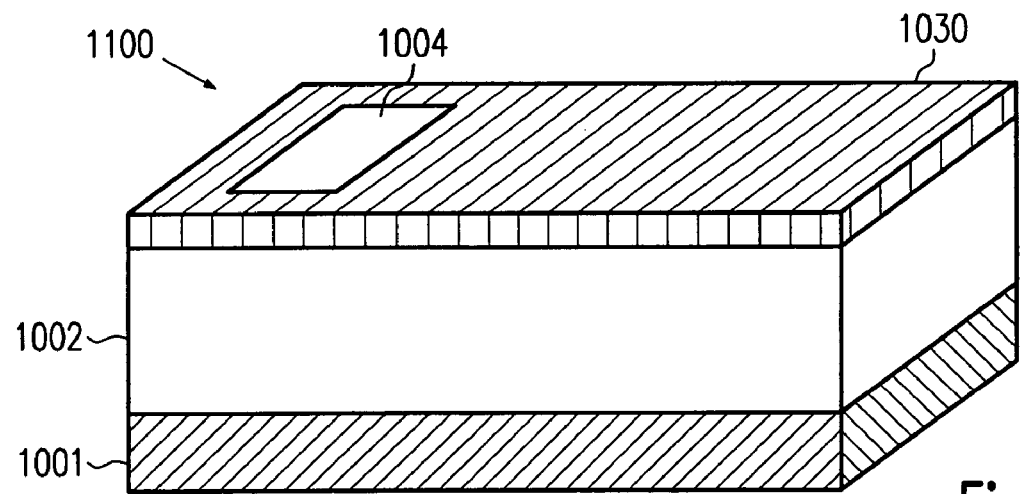

FIG. 11b shows the semiconductor structure 1100 in a later stage of the manufacturing process. A sacrificial layer 1030 is deposited on the semiconductor structure 1100. Then, a chemical mechanical polishing process is performed to planarize a surface of the sacrificial layer 1030 and to remove a portion of the sacrificial layer from the mount 1004. Thus, a top surface of the mount 1004 is exposed.

Figure 11C:
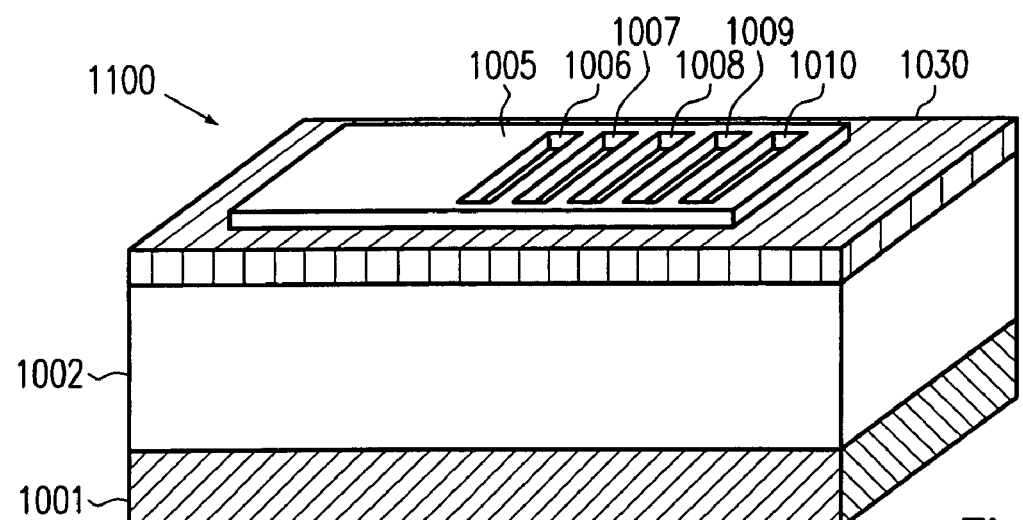

Yet another stage of the manufacturing process of the semiconductor structure 1100 is shown in FIG. 11c. The grating 1005 is formed on the sacrificial layer 1030 and on the exposed top surface of the mount 1004. To this end, a layer of a grating material is deposited on the sacrificial layer 1030 and the exposed top surface of the mount 1004. The layer of grating material is then patterned by means of known photolithography techniques. Thereby, the trenches 1006-1010 are formed. The trenches have a known predetermined spacing.

Subsequently, the semiconductor structure 1100 is exposed to an etchant adapted to selectively remove a material of the sacrificial layer 1030, whereas the grating material and materials of the mount 1004 and the layer 1002 are substantially not affected by the etchant.

Thus, the semiconductor structure 1100 as shown in FIG. 10 is obtained. In the deposition of the layer of the grating material, stress may be created in the layer of grating material. The stress may result, e.g., from an incompatibility of a crystal structure of the grating material and a crystal structure of the material of the sacrificial layer 1030. Stress in the layer of grating material may also result from different thermal coefficients of expansion of the sacrificial layer 1030 and the layer of grating material. If the layer of grating material is deposited at an elevated temperature, the layer of grating material and the sacrificial layer 1030 will tend to shrink differently as the temperature is reduced after the deposition process. Since, however, the layer of grating material and the sacrificial layer are fixed to each other, the shrinking processes of the layers constrain each other. Thus, stress is created in both layers.

As the sacrificial layer 1030 is removed, the constraints of the layer of grating material resulting from the layer being fixed to the sacrificial layer 1030 cease to exist and the grating 1005 may freely relax. If the grating 1005 is stressed, a shape of the grating 1005 will be altered in this relaxation. In particular, if the stress has a component in the plane of the grating 1005 and in a direction perpendicular to a direction of the trenches 1006-1010, a spacing s between the trenches 1006-1010 in the grating 1005 differs from the predetermined spacing of the trenches 1006-1010 provided in the patterning of the layer of grating material. The deviation between the predetermined spacing and the spacing s is a property representative of a stress condition in the layer of grating material in the semiconductor structure 1100.

A property of the stress sensitive element representative of a stress condition in the semiconductor structure is determined.

In an embodiment of the present invention wherein the first semiconductor structure is a semiconductor structure 100 as described above with reference to FIG. 1, determining the property of the stress sensitive element comprises determining a property of the line 103 of transparent material. The property of the line 103 of transparent material can be a length of an optical path of light passing through the line 103 of transparent material. The length of the optical path may be determined by means of a system 200 for measuring a stress in a semiconductor structure as described above with reference to FIG. 2, into which the semiconductor structure 100 is inserted. An alteration of the length of the optical path can be determined from a measurement of the intensity of the unified light beam 216.

In other embodiments of the present invention, the property of the line 103 of transparent material can be a wavelength of light reflected in the line 103 of transparent material.

Determining the wavelength of the reflected light may comprise inserting the semiconductor structure 100 into a system 400 for measuring a stress in a semiconductor structure comprising a spectrometer as described above with reference to FIG. 4. The wavelength of the reflected light can be determined by analyzing a spectrum of the light transmitted through the semiconductor structure 100 and/or a spectrum of the light reflected in the semiconductor structure 100.

In further embodiments of the present invention, the property of the line 103 of transparent material can be a birefringence of light transmitted through line 103. Detecting the birefringence may be performed by inserting the semiconductor structure 100 into a system 400 for measuring a stress in a semiconductor structure comprising an analyzer adapted to detect polarization properties of the transmitted light as described above with reference to FIG. 4. The birefringence of light in the line 103 of transparent material can be detected by measuring the intensity of light passing through the second polarization filter.

In an embodiment of the present invention wherein the first semiconductor structure is a semiconductor structure 500 as described above with reference to FIG. 5, determining the property of the stress sensitive element can comprise determining a deflection of the elastic element. This can be done by determining whether the beam 520 is buckled. Additionally, the buckling height d can be measured.

In an embodiment of the present invention, determining the property of the stress sensitive element 509 comprises inserting the semiconductor structure 500 in a system for measuring a stress in a semiconductor structure as described above with reference to FIG. 8. As detailed above, the deflection of the beam 520 can be detected by analyzing the height profile of the beam 520, which can be determined from an analysis of the intensity of the unified light beam 816 which comprises a pattern of interference between the first reflected light 812 reflected from the surface of the beam 520 and the second reflected light 813 being a reference beam. The buckling height of the beam 520 can also be determined from the height profile.

In other embodiments of the present invention, the deflection of the beam 520 is determined by inserting the semiconductor structure 500 in a system for measuring a stress in a semiconductor structure as described above with reference to FIG. 9. As detailed above, the height profile of the beam 520 and, thus, also the presence of buckling and the buckling height d can be determined from the light intensity measured by the light detector 909 which comprises a pattern of interference between the first reflected light 912 reflected from the surface of the beam 520 and the second reflected light reflected from the bottom surface of the trench 513.

Similarly, in an embodiment of the present invention wherein the first semiconductor structure is a semiconductor structure 700 as described above with reference to FIG. 7, determining the property of the stress sensitive element can comprise determining a deflection of the cantilever beam 720. The bending of the cantilever beam 720 and the bending height d being properties of the stress sensitive element 709 representative of a stress in the semiconductor structure 700 may be determined by observing a pattern of interference between light reflected from the surface of the cantilever beam and light reflected from a bottom surface of the trench 713 or a reference beam. The pattern of interference can be determined by inserting the semiconductor structure 700 in a system 800 for measuring a stress in a semiconductor structure as described above with reference to FIG. 8 or a system for measuring a stress in a semiconductor structure as described above with reference to FIG. 9.

In an embodiment of the present invention wherein the first semiconductor structure is a semiconductor structure 1100 as described above with reference to FIG. 11, determining a property of the stress sensitive element can comprise determining the spacing s between the trenches 1006-1010, which may be done by analyzing a diffraction pattern of light diffracted from the stress sensitive element. This can comprise inserting the semiconductor structure 1100 into a diffractometer 1200 as shown in FIG. 10.

In an embodiment of the present invention, the angle α is kept fixed. The angle β is varied by moving the detector 1012. The intensity of light scattered in the direction towards the detector 1012 is measured as a function of the angle β. Then, the spacing s between the trenches 1006-1010 is determined from a value of the angle α at which the measured intensity has a maximum, which can be done by means of a calculation known to persons skilled in the art.

In other embodiments of the present invention, the angle β is kept fixed, while the angle α is varied by moving the light source 1040. The intensity of light scattered in the direction towards the detector 1012 is measured as a function of the angle α. The spacing s between the trenches 1006-1010 is determined from a value of the angle α at which the measured intensity has a maximum, which can be done by means of a calculation known to persons skilled in the art.

In yet other embodiments of the present invention, both the angle α and the angle β are kept fixed. The light source 1040 is adapted to emit light having a plurality of wavelengths. In particular, the light source 1040 can be adapted to emit a light having a continuous spectrum.

The spectrum of the light scattered at the grating 1005 is determined. To this end, the light detector 1012 can comprise a spectrometer. As detailed above, the phase difference between the light portions reflected from the lines 1016-1020 depends on the wavelength of the scattered light. Therefore, at particular values of the angles α, β the spectrum of the scattered light comprises a maximum. A wavelength of the maximum is representative of the spacing s between the trenches 1006-1010. The wavelength of the maximum is determined from the spectrum of the scattered light measured by means of the detector 1012 and the spacing s is determined from the wavelength of the maximum by means of a calculation known to persons skilled in the art.

In further embodiments of the present invention, the light source 1040 can be adapted to emit a plurality of wavelengths. Additionally, one of the angles α, β is varied by moving one of the light source 1040 and the light detector 1012 or both. The light detector 1012 comprises a spectrometer. Thus, a plurality of spectra obtained at different values of the angles α, β can be recorded. The spacing s may be determined from the plurality of spectra using computer simulation techniques known to persons skilled in the art. Advantageously, this allows a more precise determination of the spacing s and an additional determination of further properties of the grating 1005, e.g., a depth of the trenches 1006-1010 and/or an index of refraction of the grating 1005.

The stress between the layer of grating material and the sacrificial layer 1030 can then be calculated from a difference between the measured spacing s and the predetermined spacing of the trenches in the patterning of the layer of grating material.

Determining the property of the stress sensitive element representative of a stress condition in the semiconductor structure can be performed after the completion of the manufacturing process. Determining the property of the stress sensitive element can be performed during the operation of an electrical element in the semiconductor structure. Thus, a creation or relaxation of stress induced by the operation of the electrical element and resulting, e.g., from a thermal expansion of portions of the semiconductor structure due to a current-induced formation of heat can be monitored.

In other embodiments of the present invention, the property of the stress sensitive element can be monitored in situ or in-line during the manufacturing process, in particular, if the first semiconductor structure is a semiconductor structure 100 as described above with reference to FIG. 1.

To this end, the semiconductor structure 100 can be inserted into a system 200, 400 for measuring a stress in a semiconductor structure, the system being provided in an apparatus adapted to perform physical vapor deposition, chemical vapor deposition and/or plasma enhanced chemical vapor deposition, or any other deposition process known to a person skilled in the art. Thus, the formation of stress in the semiconductor structure 100 during the deposition of at least one of the layers 104, 105 can be observed by determining the property of the line 103 of transparent material continuously or at a plurality of points in time. Additionally, the property of the line 103 of transparent material representative of the stress condition in the semiconductor structure 100 can be determined after the deposition of the layer 104 and/or the deposition of the layer 105. Thus, an alteration of the stress in the semiconductor structure 100 in an interval of the manufacturing process where no deposition is performed can be observed, which allows a monitoring of relaxation processes in the layer 104 and/or the layer 105 leading to a reduction of stress in the semiconductor structure 100.

Determining the property of the stress sensitive element may also be performed during processing steps other than a deposition of material. In particular, determining the property of the stress sensitive element can be performed during or after a thermal annealing process.

In thermal annealing, the semiconductor structure is exposed to an elevated temperature for a predetermined time. During thermal annealing, stress may be created due to different thermal coefficients of expansion of the materials in the semiconductor structure. Thermal annealing may, however, also promote a relaxation of stress in the semiconductor structure, since the elevated temperature increases the mobility of atoms and/or molecules, such that energetically unfavorable high stress arrangements of the particles can re-arrange into more favorable arrangements.

Determining the property of the stress sensitive element during a thermal annealing process may be performed by inserting the semiconductor structure in a system for measuring a stress in a semiconductor structure 200, 400, 800, 900, 1000, additionally comprising a heater adapted for increasing a temperature of the semiconductor structure and determining the property of the stress sensitive element during the operation of the heater.

The manufacturing process can be modified based on the determined property of the stress sensitive element.

The manufacturing process may be modified by altering one or more parameters of the manufacturing process. The parameters can comprise a temperature at which a manufacturing step is performed, e.g., a temperature at which one or more of the layers in the semiconductor structure are formed. The parameter may also comprise a pressure or a composition of a reactant gas in a deposition process. The parameters can comprise a composition of a substrate and/or a composition of one of the deposited layers The parameters can comprise a dimension of an element of the semiconductor structure 100, e.g., a thickness of one or more of the layers or a lateral dimension of a structural element, e.g., a width of an electrically conductive line and/or a width of an insulating portion.

In some embodiments of the present invention, the modification of the manufacturing process can comprise forming one or more additional layers of a material. In other embodiments of the present invention, the modification of the manufacturing process can comprise omitting the formation of a layer. A second semiconductor structure can be formed by means of the modified manufacturing process.

The modified manufacturing process can comprise forming an electrical element in the second semiconductor structure, e.g., an electrically conductive line similar to the electrically conductive line 110, 510, 710 in the first semiconductor structure and/or a field effect transistor. Due to the modification of the manufacturing process, the electrical element in the second semiconductor structure can be subjected to different stress conditions than an electrical element in the first semiconductor structure.

In some embodiments of the present invention, a stress sensitive element is formed in the second semiconductor structure, which can comprise a line of a transparent material similar to the line 103 in the semiconductor structure 100, a beam similar to the beam 520 in the semiconductor structure 500, a cantilever beam similar to the cantilever beam 720 in the semiconductor structure or a grating similar to the grating 1005 in the semiconductor structure 1100. The formation of the stress sensitive element in the second semiconductor structure may be performed by means of substantially the same process steps as the formation of the stress sensitive element in the first semiconductor structure.

A property of the stress sensitive element in the second semiconductor structure representative of a stress condition in the second semiconductor structure may be determined, similar to the determination of the property of the stress sensitive element in the first semiconductor structure.

The property of the stress sensitive element in the second semiconductor structure may be compared with the property of the stress sensitive element in the first semiconductor structure. Thus, information concerning the influence of the modification of the manufacturing process on the stress in a semiconductor structure can be obtained.

In some embodiments of the present invention, a plurality of first semiconductor structures is formed. Each of the first semiconductor structures is formed by means of a manufacturing process that differs from the manufacturing processes used to form the other semiconductor structures. The manufacturing processes may differ in one or more of the parameters detailed above. The manufacturing processes may also differ in whether or not an additional layer of a material is formed.

In each of the first semiconductor structures, a stress sensitive element is formed. Each of the stress sensitive elements has a property representative of a stress condition in the respective semiconductor structure. The property of the stress sensitive element in each of the plurality of first semiconductor structures is determined. Thus, information concerning the stress in each of the first semiconductor structures may be obtained.

The stress in each of the first semiconductor structures can be related to one or more of the parameters of the manufacturing process used to form the respective first semiconductor structure. Thus, a dependence of a stress in a semiconductor structure on the one or more parameters can be established. Establishing the dependence of the stress on the one or more parameters may comprise fitting a mathematical function to data comprising the one or more parameters and the stress in the first semiconductor structure formed by the manufacturing process having these parameters.

The second semiconductor structure can be formed by means of a modified manufacturing process, the modification of the manufacturing process being based on the established dependence between the stress and the first semiconductor structure and the one or more parameters of the manufacturing process.

Modifying the manufacturing process may comprise determining improved values of the one or more parameters based on the fitted mathematical function. This may be done by means of optimization methods.

In some embodiments of the present invention, the modification of the manufacturing process is adapted to reduce a stress in the second semiconductor structure. Values of the one or more parameters may be determined by minimizing a stress calculated by means of a fitted mathematical function, which can be done by means of optimization algorithms known to persons skilled in the art.

In other embodiments of the present invention, the modification of the manufacturing process is adapted to bring a stress in the second semiconductor structure close to a predetermined target stress value. Values of the one or more parameters can be obtained by minimizing a square of a difference between a stress calculated by means of a fitted mathematical function and the predetermined stress value. Alternatively, values of the one or more parameters at which the fitted mathematical function assumes the predetermined stress value may be determined. This can be done by means of solving algorithms known to the skilled person.

The second semiconductor structure can comprise an integrated circuit comprising a plurality of electrical elements and need not comprise a stress sensitive element.

In some embodiments of the present invention, an electrical element, e.g., an electrically conductive line or a field effect transistor is formed in each of the plurality of first semiconductor structures. A property of each of the electrical elements can be determined. If the electrical element comprises an electrically conductive line, a resistivity of the line can be determined. If the electrical elements comprise a field effect transistor, a mobility of charge carriers in a channel region of each of the field effect transistors can be determined.

The properties of the electrical elements in the first semiconductor structures can be related to the properties of the stress sensitive elements in the first semiconductor structures. Thus, a dependence of the property of an electrical element on a stress in a semiconductor structure can be established. Advantageously, establishing a dependence between the property of the electrical element and the stress in the semiconductor structure allows one to attribute desirable or undesirable properties of the electrical element to an influence of stress.

In further modifications of the present invention, the formation of the stress sensitive element in the first semiconductor structure may comprise forming a plurality of periodic features similar to known overlay structures used to test a precision of alignment in photolithography. A property of the plurality of periodic features, e.g., spacing between the periodic features and/or an index of refraction of the periodic features and/or a dimension of the periodic features, are determined by means of diffractometry. The stress in the semiconductor structure can be calculated from the determined property of the periodic features.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of investigating an influence of stress on an electrical element in a semiconductor structure, comprising:
   forming a stress sensitive element in said semiconductor structure;
   forming an electrical element in said semiconductor structure;
   measuring a property of said stress sensitive element, said property being representative of an intrinsic stress condition in said semiconductor structure;
   measuring a property of said electrical element; and
   relating said property of said electrical element with said property of said stress sensitive element.

2. The method of claim 1, wherein forming said stress sensitive element comprises forming a line of a transparent material in said semiconductor structure.

3. The method of claim 2, wherein measuring said property of said stress sensitive element comprises measuring a wavelength of light reflected in said line of transparent material.

4. The method of claim 2, wherein measuring said property of said stress sensitive element comprises measuring an alteration of a length of an optical path in said line of transparent material.

5. The method of claim 1, wherein forming said stress sensitive element comprises forming an elastic element.

6. The method of claim 5, wherein forming said stress sensitive element comprises depositing a layer of a first material and a layer of a second material.

7. The method of claim 6, wherein forming said stress sensitive element comprises:
   patterning said layer of said second material; and exposing said semiconductor structure to an etchant, said etchant being adapted to selectively remove said first material.

8. The method of claim 5, wherein measuring said property of said stress sensitive element comprises determining a deflection of said elastic element.

9. The method of claim 8, wherein determining said deflection of said elastic element comprises analyzing a pattern of interference between light reflected from a surface of said elastic element and light reflected from a bottom surface.

10. The method of claim 8, wherein determining said deflection of said elastic element comprises analyzing a pattern of interference between light reflected from a surface of said elastic element and a reference light beam.

11. The method of claim 8, wherein determining said deflection of said elastic element comprises scanning a surface of said elastic element.

12. The method of claim 5, wherein measuring said property of said stress sensitive element comprises measuring a stiffness of said elastic element.

13. The method of claim 12, wherein measuring said stiffness of said elastic element comprises applying a force to said elastic element.

14. The method of claim 5, wherein measuring said property of said stress sensitive element comprises determining a spacing of features provided in said elastic element.

15. The method of claim 14, wherein determining said spacing comprises analyzing a light diffracted from said features.

16. The method of claim 1, wherein measuring the property of said electrical element further comprises measuring a resistivity of the electrical element.

17. The method of claim 1, wherein the electrical element comprises a transistor and measuring the property of said electrical element further comprises measuring a channel resistance of the electrical element.

* * * * *